(12) United States Patent
Sam et al.

(10) Patent No.: US 10,737,938 B2
(45) Date of Patent: Aug. 11, 2020

(54) NANOWIRE CHAIN DEVICES, SYSTEMS, AND METHODS OF PRODUCTION

(71) Applicant: UVic Industry Partnerships Inc., Victoria (CA)

(72) Inventors: Mahshid Sam, Victoria (CA); Rustom B. Bhiladvala, Victoria (CA)

(73) Assignee: UVic Industry Partnership Inc., Victoria (CA)

( * ) Notice: Subject to any disclaimer, the term of this patent is extended or adjusted under 35 U.S.C. 154(b) by 152 days.

(21) Appl. No.: 15/789,877

(22) Filed: Oct. 20, 2017

(65) Prior Publication Data
US 2018/0111829 A1 Apr. 26, 2018

Related U.S. Application Data

(60) Provisional application No. 62/411,354, filed on Oct. 21, 2016.

(51) Int. Cl.
*B82B 3/00* (2006.01)
*C25D 13/16* (2006.01)
(Continued)

(52) U.S. Cl.
CPC ............ *B82B 3/0066* (2013.01); *C25D 13/02* (2013.01); *C25D 13/12* (2013.01); *C25D 13/16* (2013.01);
(Continued)

(58) Field of Classification Search
CPC ...... B82B 3/0066; C25D 13/02; C25D 13/12; C25D 13/16; C25D 13/22; H01L 29/0673;
(Continued)

(56) References Cited

U.S. PATENT DOCUMENTS

2002/0130311 A1 9/2002 Lieber
2008/0224123 A1* 9/2008 Martin ...................... B82B 3/00
257/23
(Continued)

FOREIGN PATENT DOCUMENTS

WO WO 2015193645 * 12/2015

OTHER PUBLICATIONS

Ahmed et al., "Quantitative Analysis of Gold Nanorod Alignment after Electric Field-Assisted Deposition," *Nano Letters*, 9(11): 3786-3794, Aug. 31, 2009.
(Continued)

*Primary Examiner* — Xiuyu Tai
(74) *Attorney, Agent, or Firm* — Klarquist Sparkman, LLP

(57) ABSTRACT

A method of depositing nanowire chains includes applying a nanowire mixture to a chain-site. The chain-site includes a patterned conductive film covering at least a portion of a surface of a substrate. The patterned conductive film includes a gap. The method also includes, after applying the nanowire mixture, forming a nanowire chain suspended adjacent to a portion of the patterned conductive film by generating an electric field proximate to the patterned conductive film; and depositing the nanowire chain across the gap by removing a liquid portion of the nanowire mixture. An average length of the nanowires of the nanowire mixture is less than a width of the gap.

21 Claims, 17 Drawing Sheets

(51) Int. Cl.
　　　C25D 13/02　　　(2006.01)
　　　C25D 13/22　　　(2006.01)
　　　C25D 13/12　　　(2006.01)
　　　H01L 29/06　　　(2006.01)
(52) U.S. Cl.
　　　CPC .......... *C25D 13/22* (2013.01); *H01L 29/0673* (2013.01)
(58) Field of Classification Search
　　　CPC .. G01N 27/02; G01N 33/0031; G01N 27/127; G01N 2033/4975; B82Y 15/00; A61B 5/082
　　　See application file for complete search history.

(56)　　　　　　References Cited

U.S. PATENT DOCUMENTS

| | | |
|---|---|---|
| 2015/0008016 A1 | 1/2015 | Poon et al. |
| 2016/0060468 A1 | 3/2016 | Kim et al. |
| 2017/0226353 A1 | 8/2017 | Zhou et al. |

OTHER PUBLICATIONS

Ahn et al., "On-chip fabrication of ZnO-nanowire gas sensor with high gas sensitivity," *Sensors and Actuators B*, 138(1): 168-173, Feb. 20, 2009.
Al et al., "Direct numerical simulation of AC dielectrophoretic particle-particle interactive motions," *Journal of Colloid and Interface Science*, vol. 417, pp. 72-79, Nov. 19, 2013.
Bae et al., "Roll-to-roll production of 30-inch graphene films for transparent electrodes," *Nature Nanotechnology*, vol. 5, pp. 574-578, Jun. 20, 2010.
Bazant et al., "Diffuse-Charge Dynamics in Electrochemical Systems," *Physical Review*, 70(2): 24 pages, Aug. 19, 2004.
Bhatt et al., "Control and Modeling of the Dielectrophoretic Assembly of On-Chip Nanoparticle Wires," *Langmuir*, 20(2): 467-476, Nov. 5, 2003.
Bhiladvala et al., "Effect of fluids on the Q factor and resonance frequency of oscillating micrometer and nanometer scale beams," *Physical Review*, 69(3): 036307-1-036307-5, Mar. 31, 2004.
Bhiladvala et al., "Nanomechanical Resonant Sensors and Fluid Interactions," *Encyclopedia of Nanotechnology, 2012 Edition*, pp. 1630-1643.
Blake et al., "Graphene-Based Liquid Crystal Device," *Nano Letters*, 8(6): 1704-1708, Apr. 30, 2008.
Boehm et al., "Formation and Frequency Response of Two-Dimensional Nanowire Lattices in an Applied Electric Field," *Langmuir*, 31(21): 5779-5786, May 15, 2015.
Boote et al., "Dielectrophoretic manipulation and electrical characterization of gold nanowires," *Nanotechnology*, 16(9): 1500-1505, Jun. 29, 2005.
Burg et al., "Electrokinetic framework of dielectrophoretic deposition devices," *Journal of Applied Physics*, 107(12): 124308-1-124308-11, Jun. 2010.
Calahorra et al., "Young's Modulus, Residual Stress, and Crystal Orientation of Doubly Clamped Silicon Nanowire Beams," *Nano Letters*, 15(5): 2945-2950, Mar. 31, 2015.
Carlson et al., "Transfer Printing Techniques for Materials Assembly and Micro/Nanodevice Fabrication," *Advanced Materials*, 24(39): 5284-5318, Oct. 9, 2012.
Catrysse et al, "Nanopatterned Metallic Films for Use as Transparent Conductive Electrodes in Optoelectronic Devices," *Nano Letters*, 10(8): 2944-2949, Jul. 22, 2010.
Castellanos et al., "Electrohydrodynamics and dielectrophoresis in microsystems: scaling laws," *J. Phys. D: Appl. Phys.*, 36(2): 2584-2597, Oct. 1, 2003.
Chaste et al., "A nanomechanical mass sensor with yoctogram resolution," *Nature Nanotechnology*, vol. 7, pp. 301-304, Apr. 1, 2012.

Cherukulappurath et al., "Rapid and Sensitive in Situ SERS Detection Using Dielectrophoresis," *Chemistry of Materials*, 26(7): 2445-2452, Mar. 7, 2014.
Chirila et al., "Highly efficient Cu(In,Ga)Se$_2$ solar cells grown on flexible polymer films," *Nature Materials*, vol. 10, pp. 857-861, Sep. 18, 2011.
Chung et al., "Solution-Processed Flexible Transparent Conductors Composed of Silver Nanowire Networks Embedded in Indium Tin Oxide Nanoparticle Matrices," *Nano Res.*, 5(11): 805-814, Oct. 22, 2012.
Collet et al., "Large-Scale Assembly of Single Nanowires through Capillary-Assisted Dielectrophoresis," *Advanced Materials*, 27(7): 1268-1273, Feb. 18, 2015.
Dan et al., "Dielectrophoretically assembled polymer nanowires for gas sensing," *Sensors and Actuators B: Chemical*, 125(1): 55-59, Feb. 3, 2007.
Dasgupta et al., "Semiconductor Nanowires—Synthesis, Characterization, and Applications," *Advanced Materials*, 26(14): 2137-2184, Mar. 6, 2014.
Dow, Isopropanol Technical Data Sheet, published 2012.
Ellmer, "Past achievements and future challenges in the development of optically transparent electrodes," *Nature Photonics*, vol. 6, pp. 809-817, Nov. 30, 2012.
Fang et al., "Determining mean and gradient residual stresses in thin films using micromachined cantilevers," *J. Micromech. Eng.*, 6(3): 301-309, 1996.
Fan et al., "Toward the Development of Printable Nanowire Electronics and Sensors," *Advanced Materials*, 21(37): 3730-3743, Jun. 24, 2009.
Fan et al., "Wafer-Scale Assembly of Highly Ordered Semiconductor Nanowire Arrays by Contact Printing," *Nano Letters*, 8(1): 20-25, Aug. 16, 2007.
Forrest et al., "The path to ubiquitous and low-cost organic electronic appliances on plastic," *Nature*, vol. 428, pp. 911-918, Apr. 29, 2004.
Freer et al., "High-yield self-limiting single-nanowire assembly with dielectrophoresis," *Nature Nanotechnology*, vol. 5, pp. 525-530, Jun. 6, 2010.
Garnett et al., "Nanowire Solar Cells," *Annu. Rev. Mater. Res.*, vol. 41, 269-295, Mar. 23, 2011.
Garnett et al., "Self-limited plasmonic welding of silver nanowire junctions," *Nature Materials*, vol. 11, pp. 241-249, Feb. 5, 2012.
Ghashghaie et al., "Effect of Low Frequency Electric Field Parameters on Chain Formation of ZnO Nanoparticles for Gas Sensing Applications," *J. Am. Ceram. Soc.*, 95(6): 1843-1850, Mar. 16, 2012.
Ghosh et al., "High figure-of-merit ultrathin metal transparent electrodes incorporating a conductive grid," *Applied Physics Letters*, 96(4): 041109-1-041109-3, Jan. 2010.
Gierhart et al., "Frequence Dependence of Gold Nanoparticle Superassembly by Dieletrophoresis," *Langmuir*, 23(24):12450-12456, Oct. 27, 2007.
Goldberger et al., "Silicon Vertically Integrated Nanowire Field Effect Transistors," *Nano Letters*, 6(5): 973-977, Mar. 30, 2006.
Green et al., "Fluid flow induced by nonuniform ac electric fields in electrolytes on microelectrodes. I. Experimental measurements," *Physical Review E*, 61(4): 4011-4018, Apr. 1, 2000.
Heidelberg et al., "A Generalized Description of the Elastic Properties of Nanowires," *Nano Letters*, 6(6): 1101-1106, May 13, 2006.
Hobbs et al., "Semiconductor Nanowire Fabrication by Bottom-Up and Top-Down Paradigms," *Chemistry of Materials*, 24(11): 1975-1991, Apr. 21, 2012.
House et al., "Numerical study on dielectrophoretic chaining of two ellipsoidal particles," *Journal of Colloid and Interface Science*, 374(1): 141-149, Jan. 28, 2012.
Hu et al., "Metal nanogrids, nanowires, and nanofibers for transparent electrodes," *MRS Bulletin*, 36(1): 760-765, Oct. 20, 2011.
Hu et al., "Scalable Coating and Properties of Transparent, Flexible, Silver Nanowire Electrodes," 4(5): 2955-2963, Apr. 28, 2010.
Huang et al., "Directed Assembly of One-Dimensional Nanostructures into Functional Networks," *Science*, 291(5504): 630-633, Jan. 26, 2001.

(56) References Cited

OTHER PUBLICATIONS

Huang et al., "Nanowires for Integrated Multicolor Nanophotonics," *Small*, 1(1): 142-147, Nov. 3, 2004.

Ilic et al., "Enumeration of DNA Molecules Bound to a Nanochemical Oscillator," *Nano Letters*, 5(5): 925-929, Apr. 26, 2005.

Jones et al., "Basic Theory of Dielectrophoresis and Electrorotation: Methods for Determining the Forces and Torques Exerted by Nonuniform Electric Fields on Biological Particles Suspended in Aqueous Media," *IEEE Engineering in Medicine and Biology Magazine*, 22(6): 33-42, Nov./Dec. 2003.

Kang et al., "A High-Speed Capacitive Humidity Sensor with On-Chip Thermal Reset," *IEEE Transactions on Electron Devices*, 47(4): 702-710, Apr. 2000.

Kang et al., "Foldable Electrochemics Enabled by Nanopaper Transfer Method," *Advanced Functional Materials*, 25(27): 4203-4210, Jul. 15, 2015.

Kang et al., "Organic Solar Cells Using Nanoimprinted Transparent Metal Electrodes," *Advanced Materials*, 20(23): 4408-4413, Dec. 2, 2008.

Kawaguchi et al., "Cut-and-Paste Customization of Organic FET Integrated Circuit and Its Application to Electronic Artificial Skin," *IEEE Journal of Solid-State Circuits*, 40(1): 177-185, Jan. 2005.

Kim et al., "Inorganic semiconductor nanomaterials for flexible and stretchable bio-integrated electronics," *NPG Asia Materials*, vol. 4, 9 pages, Apr. 20, 2012.

Kim, et al., "Unusual strategies for using indium gallium nitride grown on silicon (111) for solid-state lighting," *PNAS*, 108(25): 10072-10077, Jun. 21, 2011.

Kretschmer et al., "Pearl Chain Formation of Nanoparticles in Microelectrode Gaps by Dielectrophoresis," *Langmuir*, 20(26): 11797-11801, Nov. 24, 2004.

Kumar et al., "Chemical Vapor Deposition of Carbon Nanotubes: A Review on Growth Mechanism and Mass Production," *Journal of Nanoscience and Nanotechnology*, 10(6): 3739-3758, Jun. 2010.

Kwiat et al., "Large-scale ordered 1D-nanomaterials arrays: Assembly or not?," *Nano Today*, 8(6): 677-694, Dec. 2013.

Lee et al., "Dielectrophoresis and electrodynamics-mediated fluidic assembly of silicon resistors," *Applied Physics Letters*, 83(18): 3833-3835, Oct. 2003.

Lee et al., "Selective and Rapid Room Temperature Detection of $H_2S$ Using Gold Nanoparticle Chain Arrays," *Electroanalysis*, 23(11): 2623-2628, Sep. 29, 2011.

Lee et al., "Semitransparent Organic Photovoltaic Cells with Laminated Top Electrode," *Nano Letters*, 10(4): 1276-1279, Mar. 30, 2010.

Lee et al., "Solution-Processed Metal Nanowire Mesh Transparent Electrodes," *Nano Letters*, 8(2): 689-692, Jan. 12, 2008.

Li et al., "Bottom-up assembly of large-area nanowire resonator arrays," *Nature Nanotechnology*, vol. 3, pp. 88-92, Jan. 13, 2008.

Li, *Hybrid Integration of Nanowire Resonator Arrays*, Dissertation submitted to The Pennsylvania State University, May 2008.

Li et al., "Template-Grown Metal Nanowires as Resonators: Performance and Characterization of Dissipative and Elastic Properties," *Nano Letters*, 7(11): 3281-3284, Oct. 30, 2007.

Liu et al., "Dielectrophoretic Assembly of Nanowires," *J. Phys. Chem.*, vol. 110, pp. 14098-14106, Jul. 6, 2006.

Liu et al., "Flexible electronics based on inorganic nanowires," *Chem. Soc. Rev.*, vol. 44, pp. 161-192, Sep. 22, 2014.

Liu et al., "Large-Scale Integration of Semiconductor Nanowires for High-Performance Flexible Electronics," *ACS Nano*, 6(3): 1888-1900, Feb. 27, 2012.

Love et al., "Fabrication of Nanometer-Scale Features by Controlled Isotropic Wet Chemical Etching," *Advanced Materials*, 13(8): 604-607, Apr. 18, 2001.

Lu et al., "Semiconductor nanowires," *J. Phys. D: Appl. Phys.*, vol. 39, pp. R387-R406, Oct. 20, 2006.

Luecke et al., "Electrical Conductivity and $pH_e$ Response of Fuel Ethanol Contaminants," *Energy&Fuels*, 28(8): 5222-5228, Jul. 25, 2014.

Lumsdon et al., "Assembly of Colloidal Particles into Microwires Using an Alternating Electric Field," *Langmuir*, 21(11): 4874-4880, Apr. 9, 2005.

Madaria et al., "Large scale, highly conductive and patterned transparent films of silver nanowires on arbitrary substrates and their application in touch screens," *Nanotechnology*, 22(4): 7 pages, Apr. 20, 2011.

Madaria et al., "Uniform, Highly Conductive, and Patterned Transparent Films of a Percolating Silver Nanowire Network on Rigid and Flexible Substrates Using a Dry Transfer Technique," *Nano Res.*, 3(8): 564-573, Jul. 26, 2010.

Maijenburg et al., "Dielectrophoretic alignment of metal and metal oxide nanowires and nanotubes: A universal set of parameters for bridging prepatterned microelectrodes," *Journal of Colloid and Interface Science*, 355(2): 486-493, Dec. 10, 2010.

Mijatovic et al., "Technologies for nanofluidic systems: top-down vs. bottom-up—a review," *Lab Chip*, Issue 5, pp. 492-500, Mar. 22, 2005.

Mirtaheri et al., "Electrode Polarization lmepdance in Weal NaCl Aqueous Solutions," *IEEE Transactions on Biomedical Engineering*, 52(12): 2093-2099, Dec. 2005.

Moghimian, *Electrochemical Control for Nanoelectromechanical Device Production*, Dissertation submitted at University of Victoria, 2015.

Moghimian et al., "Rhodium nanowires: Synthesis and nanostructure tailoring by controlling hydrogen evolution," *Materials Letters*, vol. 113, 152-155, Dec. 15, 2013.

Nam et al., "Ultrasmooth, extremely deformable and shape recoverable Ag nanowire embedded transparent electrode," *Scientific Reports*, vol. 4, 7 pages, Apr. 25, 2014.

Nirmalraj et al., "Manipulating Connectivity and Electrical Conductivity in Metallic Nanowire Networks," *Nano Letters*, 12(11): 5966-5971, Oct. 12, 2012.

Oliva-Aviles et al., "Dielectrophoretic modeling of the dynamic carbon nanotube network formation in viscous media under alternating current electric fields," *Carbon*, vol. 69, pp. 342-354, Dec. 16, 2013.

Palapati et al., "Single nanowire manipulation within dielectrophoretic force fields in the sub-crossover frequency regime," *Nanoscale*, Issue 7, pp. 3109-3116, Jan. 13, 2015.

Papadakis et al., "Quantitative analysis of parallel nanowire array assembly by dielectrophoresis," *Nanoscale*, vol. 3, pp. 1059-1065, Dec. 16, 2010.

Pethig et al., "Review Article—Dielectrophoresis: Status of the theory, technology, and applications," *Biomicrofluidics*, vol. 4, pp. 022811-1-022811-35, Jun. 29, 2010.

Ramya et al., "Conducting polymers-based electrochemical supercapacitors—Progress and prospects," *Electrochimica Acta*, vol. 101, pp. 109-129, Oct. 8, 2012.

Raychaudhuri et al., "Precise Semiconductor Nanowire Placement Through Dielectrophoresis," *Nano Letters*, 9(6): 2260-2266, May 6, 2009.

Sage et al., "Neutral particle mass spectrometry with nanomechanical systems," *Nature Communications*, vol. 6, 5 pages, Mar. 10, 2015.

Sahai et al., "Thermomechanical transitions in doubly-clamped micro-oscillators," *International Journal of Non-Linear Mechanics*, 42(4): 596-607, May 2007.

Sam et al., "Field-directed assembly of nanowires: identifying directors, disruptors and indices to maximize the device yield," *Nanoscale*, 8(2): 889-900, Nov. 9, 2016.

Sam et al., "Field-directed chaining of nanowires: towards transparent electrodes," *Materials Letters*, vol. 163, pp. 205-208, Oct. 23, 2015.

San Paulo et al., "Mechanical elasticity of single and double clamped silicon nanobeams fabricated by the vapor-liquid-solid method," *Applied Physics Letters*, vol. 87, pp. 053111-1-053111-3, Jul. 29, 2015.

Scardaci et al., "Spray Deposition of Highly Transparent, Low-Resistance Networks of Silver Nanowires over Large Areas," *Small*, 7(18): 2621-2628, Sep. 19, 2011.

(56) References Cited

OTHER PUBLICATIONS

Singh et al., "One- and two-dimensional assembly of colloidal ellipsoids in ac electric fields," *Physical Review E*, vol. 79, pp. 050401-1-050401-4, May 13, 2009.

Sioss et al., "Nanoresonator chip-based RNA sensor strategy for detection of circulating tumor cells: response using PCA3 as a prostate cancer marker," *Nanomedicine*, 8(6): 1017-1025, Aug. 2012.

Smith et al., "Deterministic Assembly of Functional Nanostructures Using Nonuniform Electric Fields," *Annu. Rev. Phys. Chem.*, vol. 63, pp. 241-263, Jan. 10, 2012.

Spechler et al., "Improved Efficiency of Hybrid Organic Photovoltaics by Pulsed Laser Sintering of Silver Nanowire Network Transparent Electrode," *ACS Applied Materials & Interfaces*, 7(19): 10556-10562, Apr. 27, 2015.

Suehiro et al., "Dielectrophoretic fabrication and characterization of a ZnO nanowire-based UV photosensor," *Nanotechnology*, 17(10): 2567-2573, Apr. 28, 2006.

Suehiro et al., "Fabrication and characterization of nanomaterial-based sensors using dielectrophoresis," *Biomicrofluidics*, 4(2): 022804-1-022804-10, Jun. 29, 2010.

Suehiro et al., "Fabrication of a carbon nanotube-based gas sensor using dielectrophoresis and its application for ammonia detection by impedance spectroscopy," *J. Phys. D: Appl. Phys.*, 36(21): L109-L114, Oct. 15, 2003.

Sun et al., "Inorganic Semiconductors for Flexible Electronics," *Advanced Materials*, 19(15): 1897-1916, Jul. 12, 2007.

Tenent et al., "Ultrasmooth, Large-Area, High-Uniformity, Conductive Transparent Single-Walled-Carbon-Nanotube Films for Photovoltaics Produced by Ultrasonic Spraying," *Advanced Materials*, 21(31): 3210-3216, Aug. 21, 2009.

Theuring et al., "Laser perforated ultrathin metal films for transparent electrode applications," 23(7): A254-A262, Feb. 25, 2015.

Van De Groep et al., "Transparent Conducting Silver Nanowire Networks," *Nano Letters*, 12(6): 3138-3144, May 3, 2012.

Viventi et al., "Flexible, foldable, actively multiplexed, high-density electrode array for mapping brain activity in vivo," *Nature Neuroscience*, 14(12): 1599-1607, Dec. 2011.

Wang et al., "Directed assembly of nanowires," *Materials Today*, 12(5): 34-44, May 2009.

Whang et al., "Large-Scale Hierarchical Organization of Nanowire Arrays for Integrated Nanosystems," *Nano Letters*, 3(9): 1255-1259, Aug. 5, 2003.

Wu et al., "A transparent electrode based on a metal nanotrough network," *Nature Nanotechnology*, vol. 8, pp. 421-425, May 19, 2013.

Wu et al., "Electrospun Metal Nanofiber Webs as High-Performance Transparent Electrode," *Nano Letters*, 10(10): 4242-4248, Aug. 25, 2010.

Wu et al., "Synthesis and Electrical and Mechnical Properties of Silicon and Germanium Nanowires," *Chem. Mater.*, 20(19): 5954-5967, Sep. 13, 2008.

Xu et al., "Direct synthesis of graphene 3D-coated Cu nanosilks network for antioxidant transparent conducting electrode," *Nanoscale*, 7(24): 10613-10621, May 7, 2015.

Yang et al., "Zeptogram-Scale Nanomechanical Mass Sensing," *Nano Letters*, 6(4): 583-586, Mar. 15, 2006.

Yu et al., Recent advances in solar cells based on one-dimensional nanostructure arrays, *Nanoscale*, 4(9): 2783-2796, Mar. 16, 2012.

Zhang et al., "Deflections and curvatures of a film-substrate structure with the presence of gradient stress in MEMS applications," *J. Micromech. Microeng.*, 17(4): 753-762, Mar. 8, 2007.

Zou et al., "Interfacial Engineering of Ultrathin Metal Film Transparent Electrode for Flexible Organic Photovoltaic Cells," *Advanced Materials*, 26(22): 7 pages, Mar. 13, 2014.

\* cited by examiner

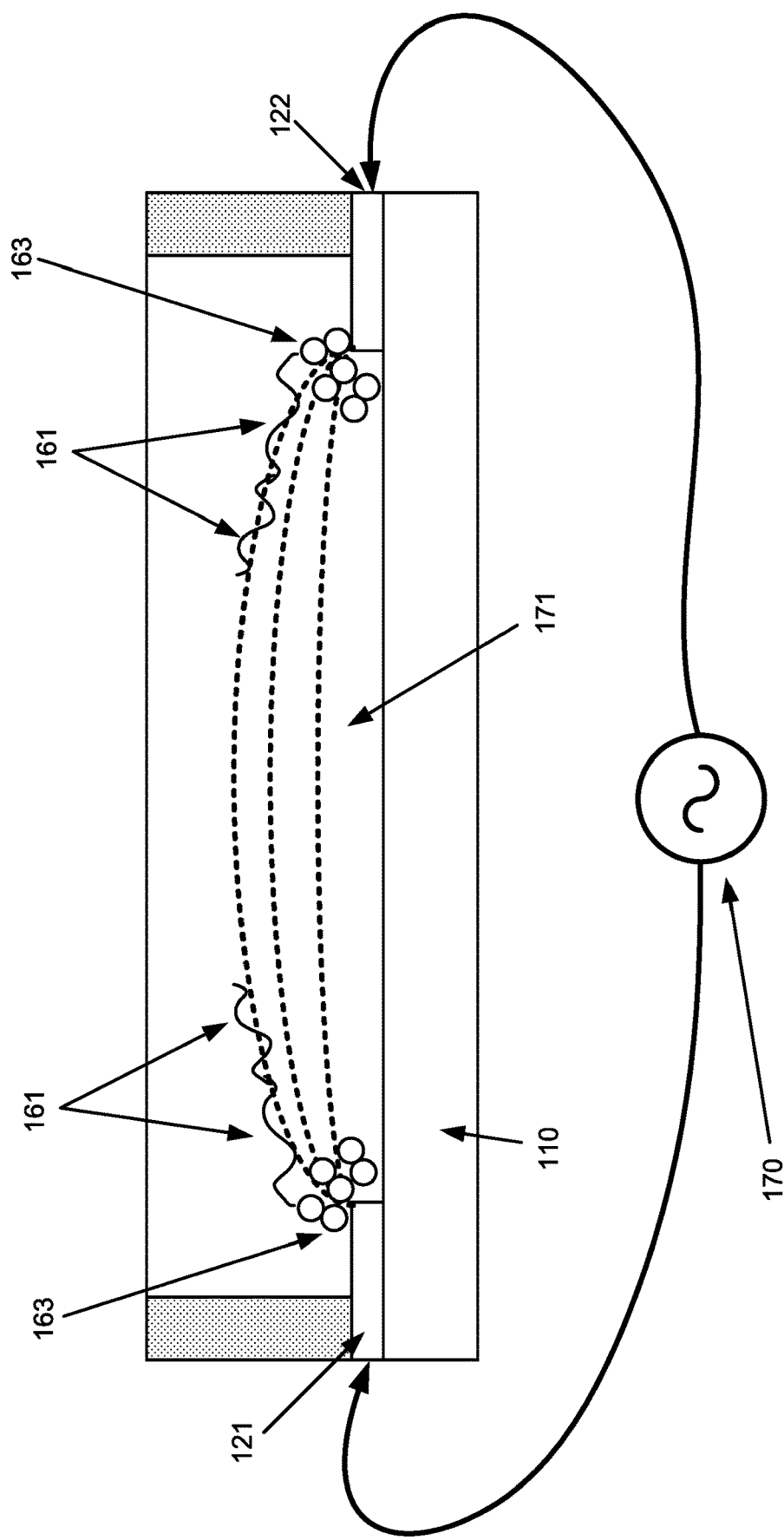

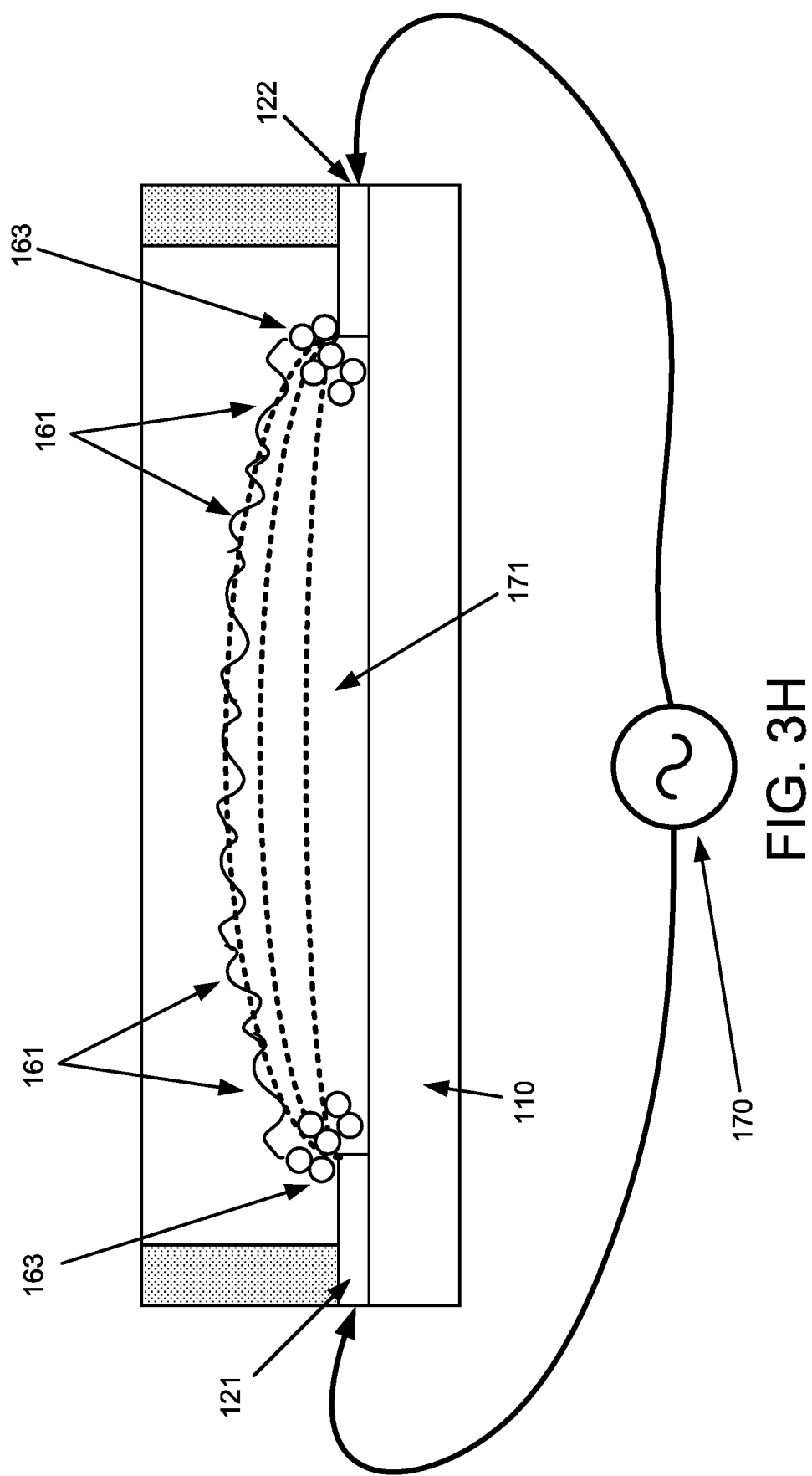

NANOWIRE CHAIN DEVICES, SYSTEMS, AND METHODS OF PRODUCTION

CROSS REFERENCE TO RELATED APPLICATIONS

This application is a utility application that claims the benefit of provisional application No. 62/411,354 filed on Oct. 21, 2016. In accordance with 37 CFR § 1.57(c), the content of provisional application No. 62/411,354 is expressly incorporated by reference.

BACKGROUND

Electronic devices such as touch screen displays or solar collectors utilize both light and conduction current during operation. Conduction currents are frequently directed by metallic conductors formed of copper, gold, silver, tin, or other optically opaque materials. Such opaque materials can prevent the transmission of light utilized by the electronic devices during operation.

SUMMARY

In one aspect, a method of depositing nanowire chains in accordance with one or more embodiments of the invention includes applying a nanowire mixture to a chain-site. The chain-site includes a patterned conductive film covering at least a portion of a surface of a substrate. The patterned conductive film includes a gap. The method also includes, after applying the nanowire mixture, forming a nanowire chain suspended adjacent to a portion of the patterned conductive film by generating an electric field proximate to the patterned conductive film; and depositing the nanowire chain across the gap by removing a liquid portion of the nanowire mixture. An average length of the nanowires of the nanowire mixture is less than a width of the gap.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 3G shows a side view diagram of an example of applying an electric field to a mixture including nanowires in accordance with one or more embodiments of the invention.

FIG. 3H shows a side view diagram of an example of applying a second mixture including nanowires while an electric field is applied in accordance with one or more embodiments of the invention.

DETAILED DESCRIPTION

Figure 1A:
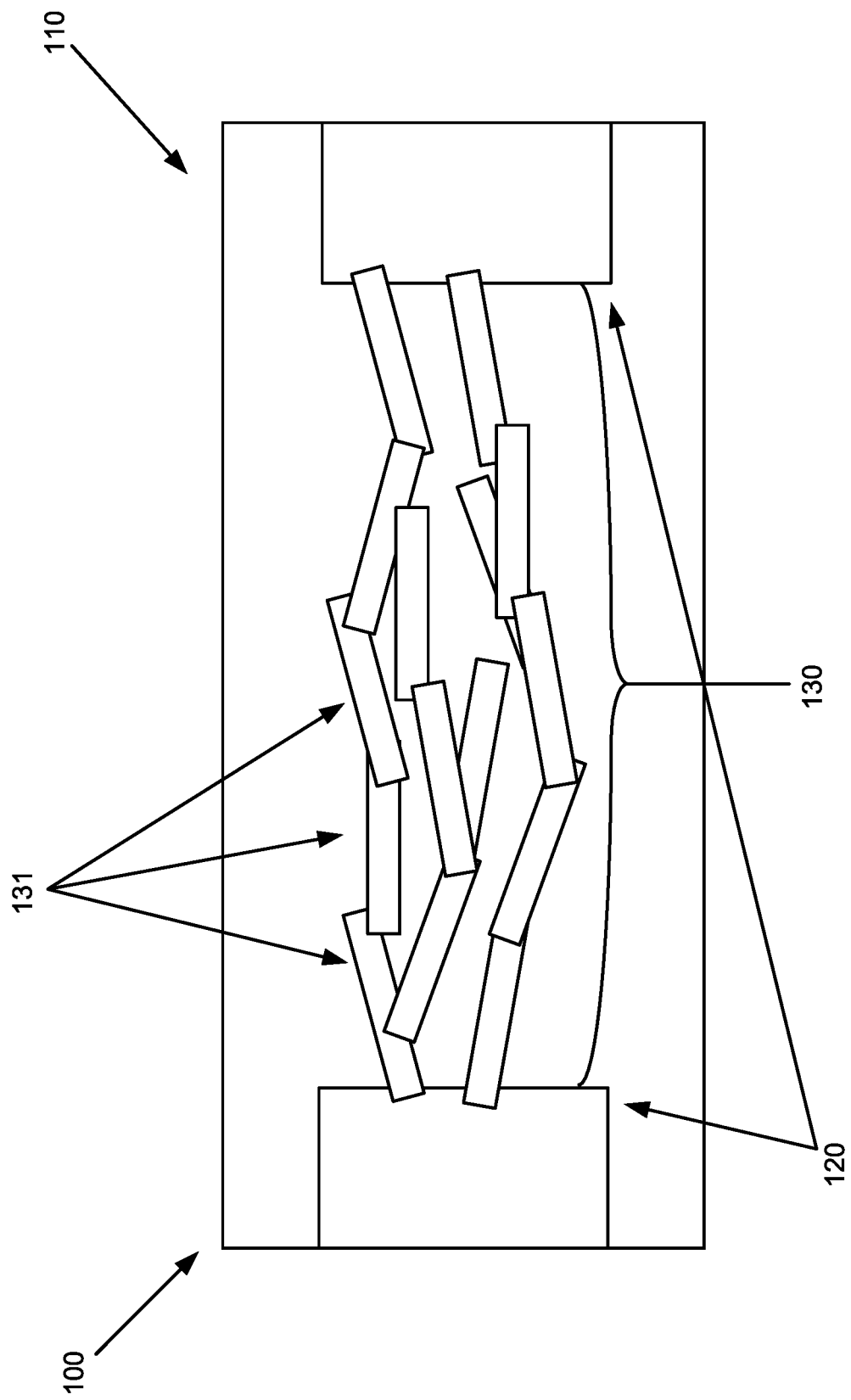
FIG. 1A shows a top view diagram of a nanowire chain device accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of FIGS. 1A-3I, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment, which may be implemented in addition to, in conjunction with, or in place of the embodiments described with regard to a corresponding like-named component in any other figure.

In general, embodiments of the invention relate to nanowire chain devices, systems that include nanowire chain devices, and methods for producing nanowire chain devices and/or systems. A nanowire chain device may be an electronic and/or an electromechanical device that utilizes a nanowire chain in the operation and/or function of the device.

A nanowire chain may be a physical structure including nanowires. Each of the nanowires may have an average length that is smaller than a gap or other structure to be bridged by the nanowire chain. The nanowires may be disposed over a surface and may be interconnected to each other to form an electrically conductive structure, i.e., a chain. The nanowires may be aligned or substantially aligned in a direction. As used herein, substantially aligned means that a length of each nanowire of a majority of the nanowires are aligned to within ±20° of the direction.

In one or more embodiments of the invention, the nanowire chain may only cover a portion of the surface and thereby enable light or other electromagnetic radiation to be transmitted through the nanowire chain. In other words, the nanowire chain may be transparent, translucent, or otherwise enable the transmission or partial transmission of electromagnetic radiation through the nanowire chain. In one or more embodiments of the invention, the nanowire chain may transmit greater than 60% of incident light at normal incidence.

A nanowire device in accordance with one or more embodiments of the invention includes a nanowire chain disposed in a gap between electrical conductors of a circuit. The circuit may apply electrical current to the electrical conductors and thereby apply the electrical current to the nanowire chain. Electromagnetic radiation may be transmitted through the gap and through the nanowire chain. For example, a nanowire device may be a touch screen display and the nanowire chain be disposed in a gap. The gap may be disposed between a light generating element, such as a light emitting diode, and a user of the display. Light generated may be transmitted through the gap, from the light emitting diode, to the user due to the optical properties of the nanowire chain while still providing a conduction path between the electrical conductors of the circuit.

A system in accordance with one or more embodiments of the invention may include multiple nanowire chain devices disposed in individual gaps between electrical conductors of one or more circuits. In other embodiments, multiple nanowire chain devices may be attached to each other to form circuit elements interconnected to traditional conductive circuitry. Each of the nanowire chain devices may be separately addressable by the one or more circuits and thereby electrical current may be selectively applied to one or more nanowire chains.

A method of manufacturing nanowire chain device in accordance with one or more embodiments of the invention may include depositing nanowires in a gap of an electrical circuit via a wet solution processing technique. By wet solution processing, the nanowires may be placed in gap in a short period of time. During the wet solution processing, electric fields may be applied to a mixture including nanowires that preferentially directs and/or aligns the nanowires to be disposed in the gap during the wet solution processing.

FIG. 1A shows a top view diagram of a nanowire chain device (100) in accordance with one or more embodiments of the invention. The nanowire chain device (100) may function as, for example, a sensor, a conductor, a track, or any other type of electronic component. The nanowire chain device (100) may be integrated as a component of a larger electronic device or system. The nanowire chain device (100) includes a substrate (110), a patterned conductive film (120) disposed on the substrate (110), and a nanowire chain (130) disposed on the patterned conductive film (120). Each of the aforementioned components of the nanowire chain device (100) is described below.

The substrate (110) may be a physical structure on which other components of the system are disposed. In one or more embodiments of the invention, the substrate may be a wafer. The wafer may be, for example, silicon, gallium nitride, or other semiconducting materials. In one or more embodiments of the invention, the substrate may be a planar slab. The planar slab may be, for example, aluminum oxide, glass, sapphire, or other dielectric material. In some embodiments of the invention, the substrate may be a polymer film such as polyimide, polyethylene terephthalate, nylon, or any other type of plastic film. The substrate (110) may be other materials without departing from the invention.

The patterned conductive film (120) may be a physical structure disposed on the substrate (110). The patterned conductive film (120) may be a metal such as, for example, copper, gold, silver, tin, aluminum, or any other conducting metal. The patterned conductive film (120) may be other conductive materials without departing from the invention. For example, the patterned conductive film (120) may be indium tin oxide, a conductive polymer, or other non-metallic conductor.

The patterned conductive film (120) may be divided into a number of portions to form any number of nanowire chain-sites. As used herein, a nanowire chain-site is a location within the nanowire chain device (100) where a nanowire chain (130) is to be disposed. For example, the electric circuit may include a number of gaps. A nanowire chain may be disposed across each gap. For example, nanowires may be directly connected to a first side of a gap in the electric circuit, connected to each other across a width of the gap, and connected to a second side of the gap in the electric circuit. The electric circuit may electrically connect each end of each nanowire chain to other electronic devices of the circuit. The other electronic devices may be transistors, diodes, amplifiers, filters, digital signal processors, or any other type of electronic component.

The nanowire chain (130) may be a physical structure. The nanowire chain (130) may include a number of nanowires. Each of the nanowires may be a cylindrical structure formed of one or more materials that has a length that is much larger than its diameter. For example, a nanowire may have a diameter of 100 nanometers and a length of 10 micrometers. The nanowires may have other lengths and/or diameters without departing from the invention.

Each of the nanowires of the nanowire chain (130) may be electrically connected to other nanowires of the nanowire chain (130) and thereby form an electrical connection that spans multiple nanowires. All of the nanowires may not be electrically connected to all of the other nanowires of the nanowire chain (130). For example, the nanowire chain (130) may include multiple, separate groups of nanowires that are electrically connected only to nanowires of each separate group. Thus, the nanowire chain (130) may include multiple, independent electrically conductive paths.

In one or more embodiments of the invention, connection of nanowires to each other is directed by dipole-dipole interaction between polarized nanowires.

Each of the nanowires (131) of the nanowire chain (130) may be aligned or substantially aligned to a direction. The direction may be along a gap to be bridged by the nanowire chain (130).

Figure 1B:
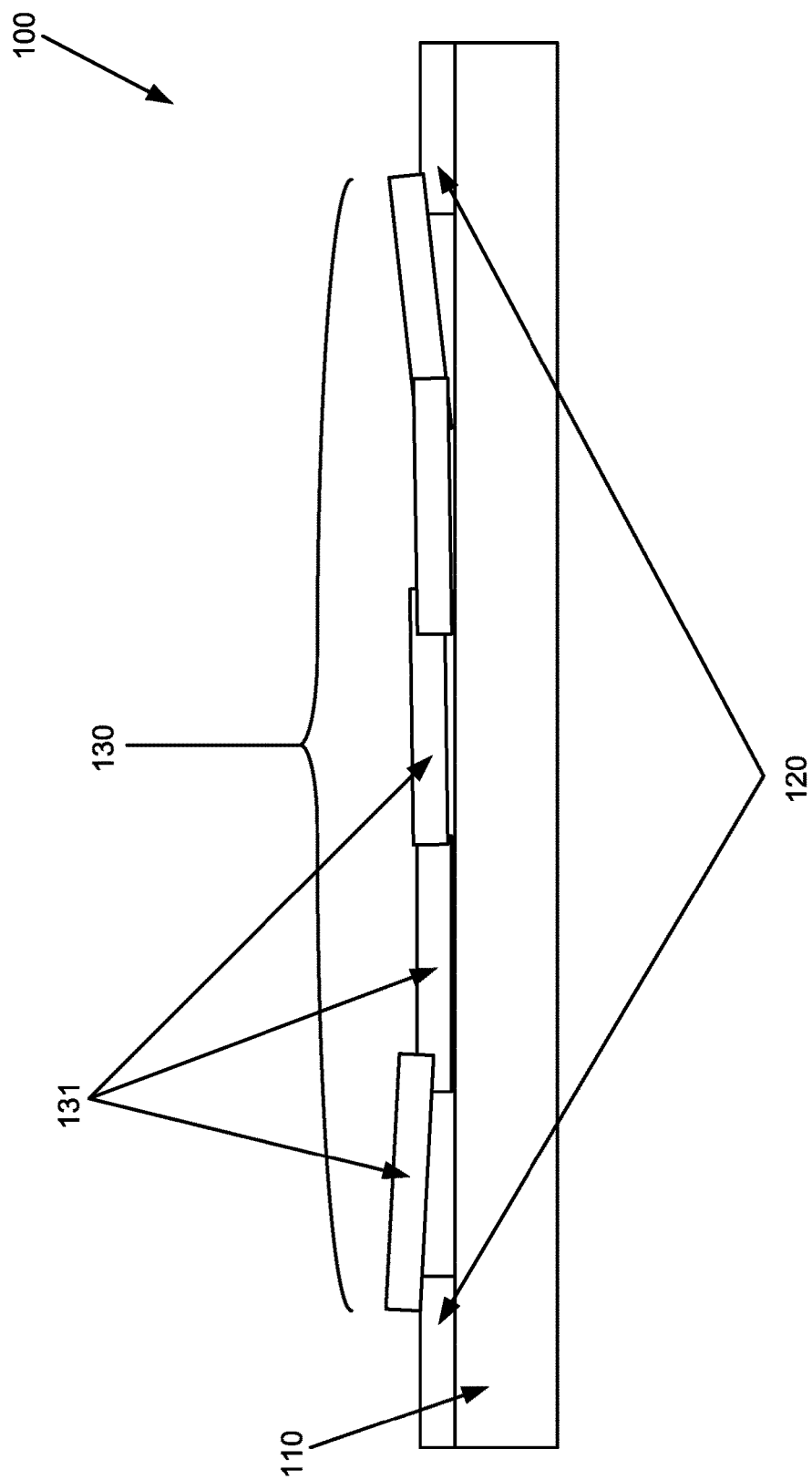
FIG. 1B shows a side view diagram of a nanowire chain device accordance with one or more embodiments of the invention.

The nanowire chain (130) may be disposed across a gap in the patterned conductive film (120). In one or more embodiments of the invention, a first end of the nanowire chain (130) may be directly connected to the patterned conductive film (120) at a first end of the gap and a second end of the nanowire chain (130) may be directly connected to the patterned conductive film (120) at a second end of the gap. FIG. 1B shows a side view of the nanowire chain device (100) shows in FIG. 1A. As seen from FIG. 1B, each end of the nanowire chain (130) may be directly connected to the patterned conductive film (120).

In other embodiments of the invention, only one end of the nanowire chain (130) may be connected to the patterned conductive film (120) and the other end of the nanowire chain (130) may not be connected to the patterned conductive film (120). For example, the other end may be connected to a second nanowire chain (not shown) or other electronic component and/or device. The second nanowire chain may, for example, be aligned to a direction that is different that the direction of alignment of the nanowire chain (130), e.g., a T or L junction.

In one or more embodiments of the invention, the patterned conductive film (120) may have a geometry that corresponds to each nanowire chain feature and the direction of alignment of the nanowires of each nanowire chain feature. These features may be formed based on electric field distributions proximate to the patterned conductive film (120) while nanowire mixtures are applied.

Embodiments of the invention include method of producing nanowire chain devices. The methods may enable nanowire chain devices to be produced quickly and at low cost. FIGS. 2A-2F illustrate method of producing nanowire devices in accordance with embodiments of the invention.

Figure 2A:
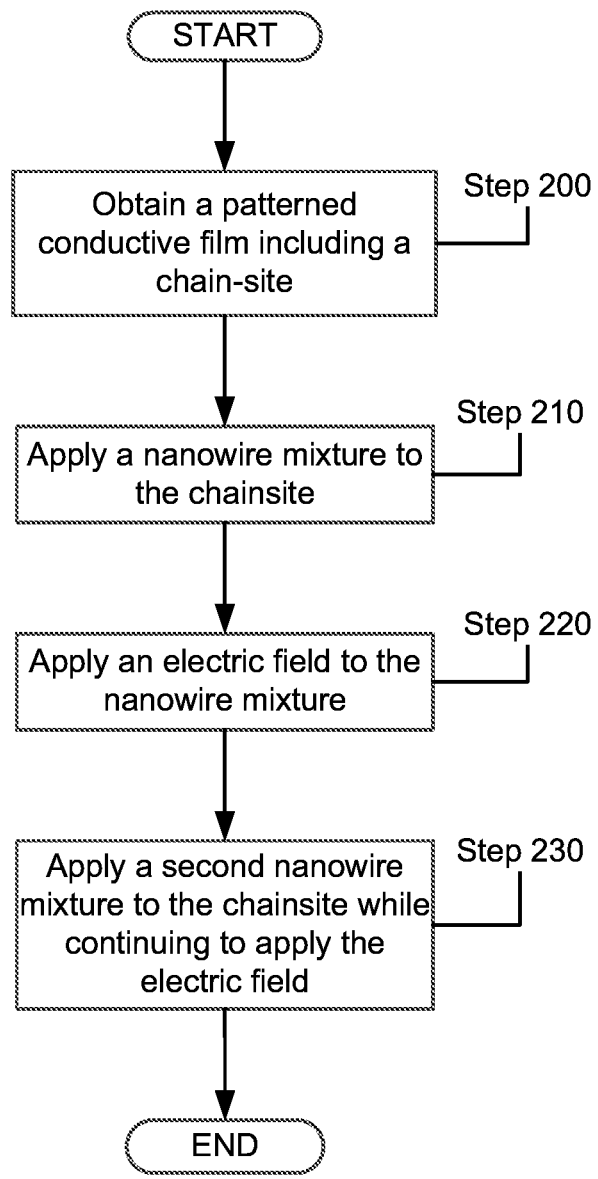
FIG. 2A shows a flowchart of a method of producing a nanowire chain device in accordance with one or more embodiments of the invention.

FIG. 2A shows a flowchart in accordance with one or more embodiments of the invention. The method depicted in FIG. 2A may be used to produce a nanowire chain device in accordance with one or more embodiments of the invention. One or more steps shown in FIG. 2A may be omitted, repeated, and/or performed in a different order among different embodiments. For example, Step 220 may be performed after step 230 without departing from the invention. The method shown in FIG. 2A may be performed by, for example, a factory or other manufacturing facility.

In Step 200, a patterned conductive film is obtained. The obtained patterned conductive film may be disposed on a substrate. The patterned conductive film may be obtained by the method shown in FIG. 2B. The patterned conductive film may be obtained via other methods without departing from the invention.

The patterned conductive film may include any number of chain-sites where nanowire chains are to be disposed. The chain-sites may be, for example, portions of the patterned conductive film that include gaps.

In Step 210, a nanowire mixture may be applied to a chain-site. The nanowire mixture may include a number of nanowires and a fluid. The nanowire mixture may be applied by depositing the nanowire mixture via a metering process such as a pipette. The nanowire mixture may be applied to the chain-sites by the method shown in FIG. 2C. The nanowire mixture may be applied to the chain-sites by another method without departing from the invention.

In Step 220, an electric field is applied to the nanowire mixture. The electric field may be applied while the nanowire mixture is disposed on the chain-site. The electric field may be applied by the method shown in FIG. 2D. The electric field may be applied by other methods without departing from the invention.

In Step 230, a second nanowire mixture may be applied to the chain-site while continuing to apply the electric field. The nanowire mixture may include a second number of nanowires and a second fluid. The nanowire mixture may be applied by depositing the second nanowire mixture via a metering process such as a pipette. The second nanowire mixture may be applied to the chain-sites by the method shown in FIG. 2D. The second nanowire mixture may be applied to the chain-sites by another method without departing from the invention.

In one or more embodiments of the invention, the method may end following Step 230. In other embodiments of the invention, the method may continue following the method shown in FIG. 2F.

Figure 2B:
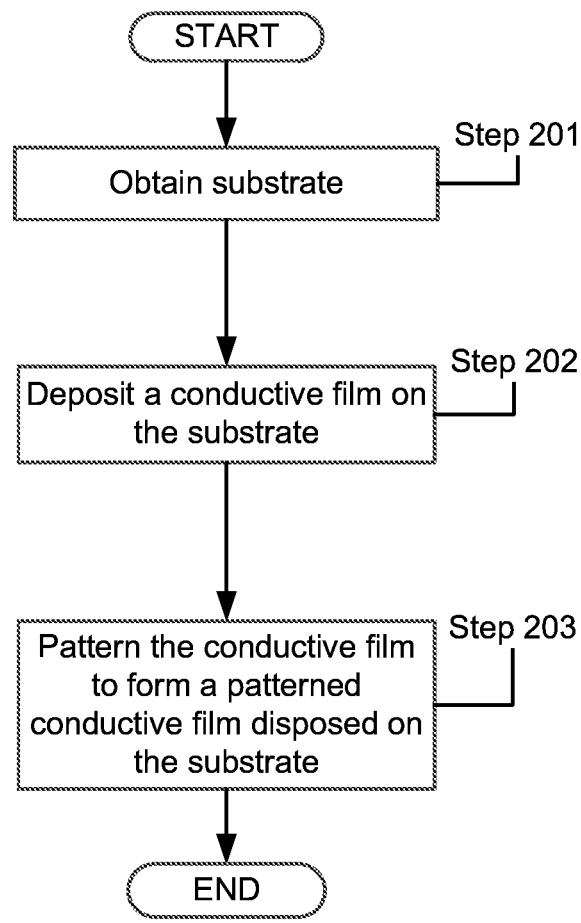
FIG. 2B shows a flowchart of a method of forming a patterned conductive film in accordance with one or more embodiments of the invention.

FIG. 2B shows a flowchart in accordance with one or more embodiments of the invention. The method depicted in FIG. 2B may be used to obtain a patterned conductive film in accordance with one or more embodiments of the invention. One or more steps shown in FIG. 2B may be omitted, repeated, and/or performed in a different order among different embodiments.

In Step 201, a substrate is obtained. The substrate may be a physical structure such as a wafer, a slab, a circuit card, a plastic film, or other structure for support of other structures.

In Step 202, a conductive film is deposited onto the substrate. The conductive film may be a metal film. The metal film may be copper, gold, silver, aluminum, tin, or other conductive metal. The conductive film may be another conductive material, other than a metal, without departing from the invention. For example, the conductive film may be indium tin oxide or a conductive polymer. In one or more embodiments of the invention, the conductive film may have a conductivity greater than 10000 Siemens per meter. In one or more embodiments of the invention, the conductive film may have a conductivity greater than 100 Siemens per meter and less than 100000 Siemens per meter.

The conductive film may be deposited by chemical deposition, physical deposition, or other methods. Chemical deposition may be performed by electroplating, electroless plating, chemical bath deposition, spin coating, chemical vapor deposition, atomic layer deposition, or any other chemical deposition process. Physical deposition may be performed by physical vapor deposition, sputtering, molecular beam epitaxy, pulsed laser deposition, cathodic arc deposition, electrohydrodynamic deposition, or any other type of physical deposition process.

In Step 203, the conductive film is patterned. Patterning the conductive film may form a patterned conductive film. The patterned conductive film may include any number of tracks, gaps, chain-sites for placement of nanowires, or any other features of an electric circuit.

The conductive film may be patterned by photolithographic methods, physical machining, laser ablation, or any other method of selectively removing portions of the conductive film to form a pattern.

The method may end following Step 203.

Figure 2C:
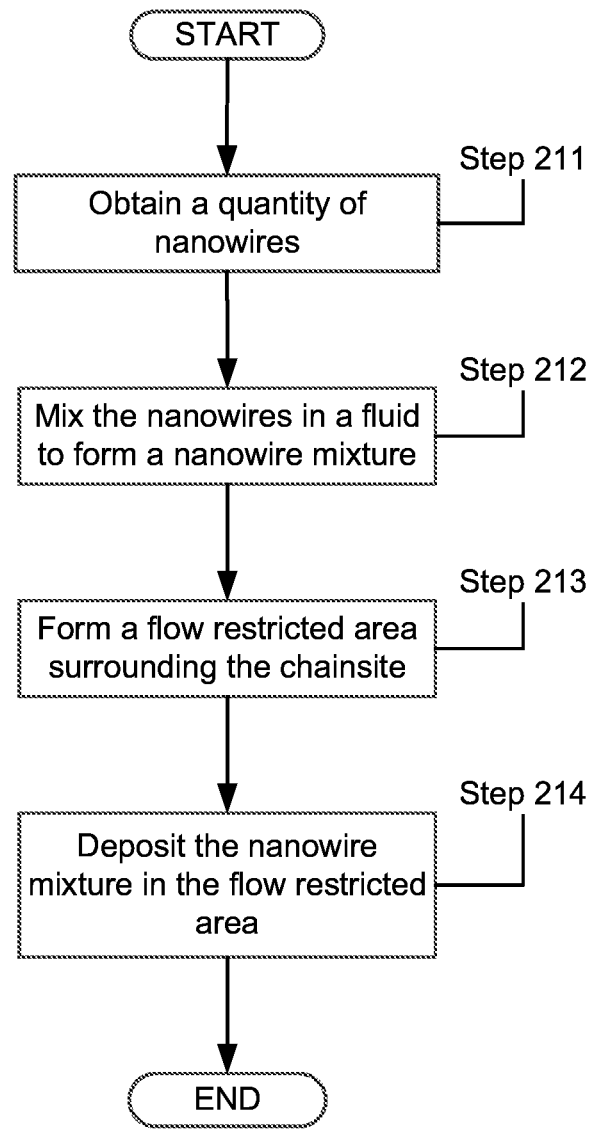
FIG. 2C shows a flowchart of a method of applying a mixture including nanowires in accordance with one or more embodiments of the invention.

FIG. 2C shows a flowchart in accordance with one or more embodiments of the invention. The method depicted in FIG. 2C may be used to apply a nanowire mixture to a chain-site in accordance with one or more embodiments of the invention. One or more steps shown in FIG. 2C may be omitted, repeated, and/or performed in a different order among different embodiments.

In Step 211, a quantity of nanowires may be obtained. The nanowires may be of any material as may be desired. For example, the nanowires may be a conducting or semiconducting material. In one or more embodiments of the invention, the nanowires may be rhodium. In other embodiments of the invention, the nanowires may be carbon nanotubes. In other embodiments of the invention, the nanowires may be a conductive material such as, for example, silver, gold, copper, or tin. In still further embodiments of the invention, the nanowires may be a metal alloy.

In one or more embodiments of the invention, the nanowires may have an average length that is much less than a width of a gap of a chain-site. As used herein, much less than the width of the gap is less than one tenth of the width of a gap in the patterned conductive film at a chain-site. In one or more embodiments of the invention, the nanowires may have an average length that is one tenth the width of a gap in the patterned conductive film at a chain-site. In one or more embodiments of the invention, the nanowires may have an average length that is one hundredth the width of a gap in the patterned conductive film at a chain-site. One of ordinary skill in the art will appreciate that nanowires may have varying lengths and an average length of the nanowires refers to a mean length of each of the nanowires.

In one or more embodiments of the invention, the quantity of nanowires proportional to a number of the chain-sites, e.g., one thousand nanowires for each chain-site. In one or more embodiments of the invention, the quantity of nanowires is greater than 10,000,000 times the number of chain-sites.

In Step 212, the nanowires are mixed with a second material to form a mixture. The second material may be a fluid. In one or more embodiments of the invention, mixing the nanowires with the second material may suspend the nanowires in the second material.

In one or more embodiments of the invention, the fluid may have a low viscosity. As used herein, a low viscosity is less than 5 centipoise. In one or more embodiments of the invention, the fluid may have a very low viscosity. As used herein, a very low viscosity is less than 2 centipoise.

The fluid may be, for example, ethanol. The fluid may be other materials or combinations of materials without departing from the invention. For example, the fluid may be a mixture of ethanol and methanol, a mixture of ethanol and water, a mixture of ethanol and ethylene glycol, or other mixtures of fluids. The fluid may include polar solvents, non-polar solvents, or a combination thereof. In one or more embodiments of the invention, the non-polar solvent may be carbon tetrachloride.

In one or more embodiments of the invention, the second material may include a number of electrically-polarizable molecules. As will be described below, the polarizable molecules may facilitate the chaining of nanowires to form a nanowire chain.

In one or more embodiments of the invention, the mixture including the nanowires may be formed by stirring the nanowires into a predetermined quantity of the second material. In one or more embodiments of the invention, the mixture including the nanowires may be formed by sonicating the nanowires into a predetermined quantity of the second material.

The mixture may include other materials such as ligands, stabilizers, polymers, or other materials. The other materials may improve the ability of the nanowires to be suspended in the second material. The other materials may modify a viscosity, surface tension, wetting, or other rheological property of the mixture.

In Step 213, a flow restricted area is formed. The flow restricted area may be formed by applying a dam near the chain-site. A dam may be a physical structure, such as a gasket, that forms a seal between the dam and nanowire chain device when the dam is pressed against the nanowire chain device. The seal between the dam and the nanowire chain device may prevent a mixture included nanowires from flowing along the surface of the nanowire chain device and thereby form a flow restricted area. The flow restricted area may be formed around all of the chain-sites.

In one or more embodiments of the invention, using the dam, nanowire chains may be formed in specific locations. In one or more embodiments of the invention, a dam includes multiple slits with a known distance between each slits so that nanowire chains may be formed in each slit in isolation from other nanowire chains. These multiple, separate groups of nanowires may have different width and separation distance based on the width of the slits and distance between slits inside the dam.

In Step 214, a portion of the mixture including nanowires is deposited in the flow restricted area. The portion may be deposited by, for example, pipetting, dispensing, or otherwise transporting the portion to the flow restricted. When in the flow restricted area, the mixture may flow along the nanowire chain device, into the chain-sites, and thereby be disposed on each of the chain-sites within the flow restricted area.

The method may end following Step 214.

Figure 2D:
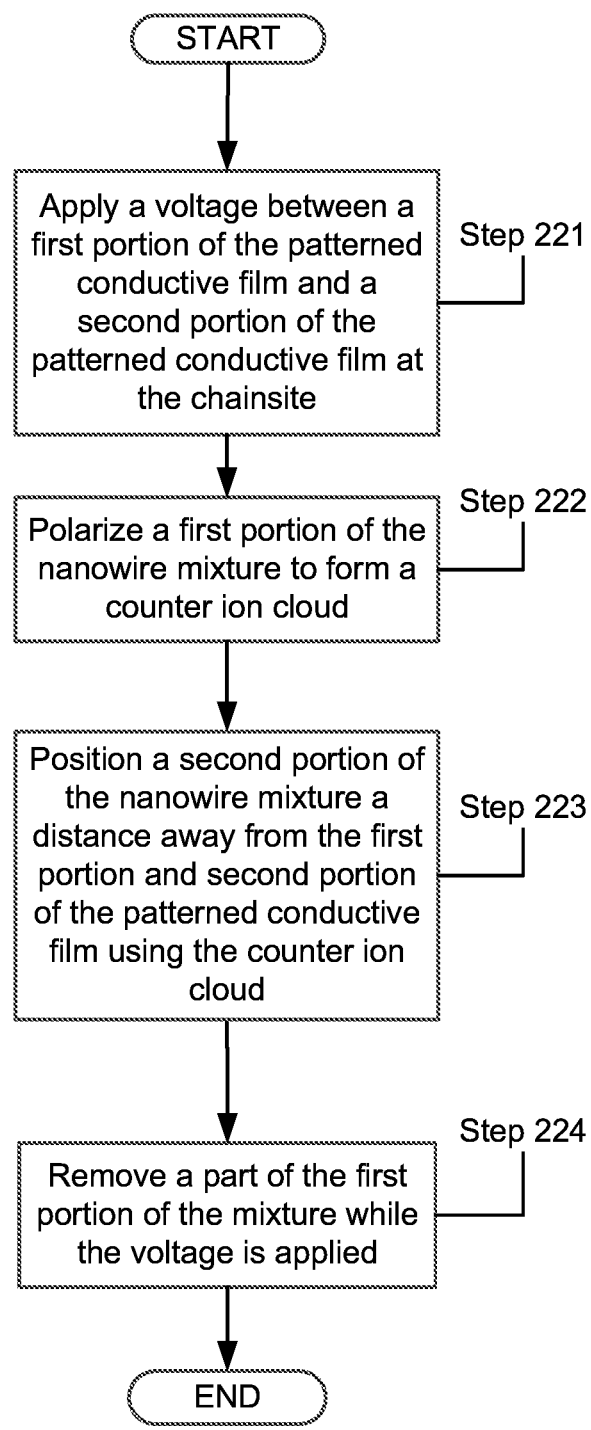
FIG. 2D shows a flowchart of a method of applying an electric field to a mixture including nanowires in accordance with one or more embodiments of the invention.

FIG. 2D shows a flowchart in accordance with one or more embodiments of the invention. The method depicted in FIG. 2D may be used to apply an electric field to the nanowire mixture in accordance with one or more embodiments of the invention. One or more steps shown in FIG. 2D may be omitted, repeated, and/or performed in a different order among different embodiments.

In Step 221, a voltage may be applied between a first portion of the patterned conductive film and a second portion of the patterned conductive film at each chain-site. Each of the first portion and the second portion of the patterned conductive film may be disposed on opposite sides of a gap in the patterned conductive film. Applying the voltage may generate an electric field across the gap. The electric field may be a fringing field that extends above the plane, in the plane, and below the plane in which the patterned conductive film lies. The voltage may be applied while the mixture including nanowires is disposed on the chain-site and therein within the gap.

In Step 222, a first portion of the mixture may be polarized. The first portion of the mixture may be a plurality of polarizable molecules. Applying the electric field may polarize the polarizable molecules to generate an ion cloud disposed proximate to each end of the first portion and the second portion of the patterned conductive film.

In Step 223, a second portion of the mixture is positioned a distance away from the first portion of the mixture and is positioned a distance away from the second portion of the patterned conductive film using the ion cloud. Applying the voltage may polarize the nanowires disposed within the mixture. When polarized, the nanowires may align to the fringing electric field between the first portion and the second portion of the patterned conductive film by dielectrophoresis forces but prevented from coming into contact with the first portion or the second portion of the patterned conductive film due to repulsive forced exerted by the ion cloud disposed proximate to each portion of the patterned conductive film. Aligning the nanowires to the electric field may cause the nanowires to form chains of nanowires suspended above the patterned conductive film and aligned between the first portion and the second portion of the patterned conductive film.

In one or more embodiments of the invention, the nanowire chains may be formed by additively chaining additional nanowires to the nanowire chains. Continued chaining may increase a length of the chain.

In one or more embodiments of the invention, the electric field may be a time varying field. For example, an alternating voltage source may be applied between the first portion of the patterned conductive film and the second portion of the patterned conductive film. In one or more embodiments of the invention, the time varying field may have a frequency of less than $10^{10}$ Hz, i.e., less than 10 gigahertz. In one or more embodiments of the invention, the time varying field may have a frequency of less than $10^7$ Hz, i.e., less than 10 megahertz. In one or more embodiments of the invention, the time varying field may have a frequency of greater than $10^4$ Hz, i.e., greater than 10 kilohertz. In one or more embodiments of the invention, the time varying field may have a frequency of greater than $10^5$ Hz, i.e., greater than 100 kilohertz. In one or more embodiments of the invention, the time varying field may have a frequency of greater than $10^6$ Hz, i.e., greater than 1 megahertz. In one or more embodiments of the invention, the time varying field may have a frequency of greater than $10^4$ Hz and less than $10^{10}$ Hz, i.e., greater than 10 kilohertz and less than 10 gigahertz. A frequency in the ranges disclosed herein may prevent polarization of the first portion of the patterned conductive film and second portion of the patterned conductive film that repel nanowires from chain-sites and may prevent formation of electroosmotic flows adjacent to the patterned conductive film that would repel the nanowires from the chain-sites.

In one or more embodiments of the invention, the time varying field may have a frequency between of $10^4$ Hz to $10^7$ Hz. A frequency in this range may prevent polarization of the first portion of the patterned conductive film and second portion of the patterned conductive film that repels nanowires from chain-sites and may prevent formation of electroosmotic flows adjacent to the patterned conductive film that would repel the nanowires from the chain-sites. The disclosed frequency range may also prevents negative dielectrophoretic force that repels the nanowires from the conductive film.

In one or more embodiments of the invention, the time varying field may have a minimum frequency determined by the following equations:

$$\beta = N_V - N_{EO}$$

$$N_{EO} = \frac{v}{v_{max}} = \frac{4\Omega^2}{(1+\Omega^2)^2}$$

$$\Omega = \frac{\pi}{2} x\kappa\omega\left(\frac{\varepsilon_m}{\sigma_m}\right)$$

$$N_V = \frac{V_{eff}}{V_{rms}} = \left|\frac{1}{1+\frac{2}{j\omega R_s C_{eq}}}\right| = \frac{1}{\sqrt{1+\left(\frac{2}{\omega R_s C_{eq}}\right)^2}}$$

where Rs is the electrical resistance of the nanowire mixture between the portions of the patterned conductive film on either side of the gap at a chain-site, Ceq is the capacitance between the portions of the patterned conductive film on either side of the gap at a chain-site, w is $2\pi f$, $\varepsilon_m$ is the permittivity of the nanowire mixture, x is half the width of the gap, κ is the reciprocal Debye length of a double layer, $\sigma_m$ is the electrical conductivity of the nanowire mixture. The above set of equations only includes a single independent variable, f, the frequency of the applied electric field. The frequency may be varied to maximize β. The frequency that maximizes β may be selected as the minimum frequency of the time varying field.

In one or more embodiments of the invention, the frequency that maximizes β may be selected as the frequency of the time varying field in order to increase the number of chained nanowires. At frequencies higher than the frequency at maximum β electrode polarization and electroosmotic force may not disrupt nanowire positioning. However, the director force exerted on the polarized nanowires, which moves nanowires towards the patterned conductive film, decreases with increasing frequency. Since nanowire chaining would be disrupted by the decrease of this director force, the selected frequency may limit the frequency to achieve the maximum value of β.

In one or more embodiments of the invention, the voltage may have a root-mean-square (rms) magnitude of greater than 4 Vrms. In one or more embodiments of the invention, the voltage may have a root-mean-square magnitude of greater than 5 Vrms. In one or more embodiments of the invention, the voltage may have a root-mean-square magnitude of greater than 6 Vrms. In one or more embodiments of the invention, the voltage may have a root-mean-square magnitude of greater than 7 Vrms. In one or more embodiments of the invention, the voltage may have a root-mean-square magnitude of greater than 4 Vrms and less than 10 Vrms. In one or more embodiments of the invention, the voltage may have a root-mean-square magnitude of greater than 4 Vrms and less than 7 Vrms. Voltages outside these disclosed ranges may not sufficiently polarize the nanowires to attract the nanowires to the chain-sites and thereby fail to cause the nanowires to be placed properly.

In Step 224, a part of the mixture applied to the chain-site is removed. The part of the mixture may be removed by evaporating a liquid portion of the mixture. The mixture may be removed by other methods without departing from the invention. Removing part of the mixture may result in nanowires in the mixture being chained together. The method may end following Step 224.

Figure 2E:
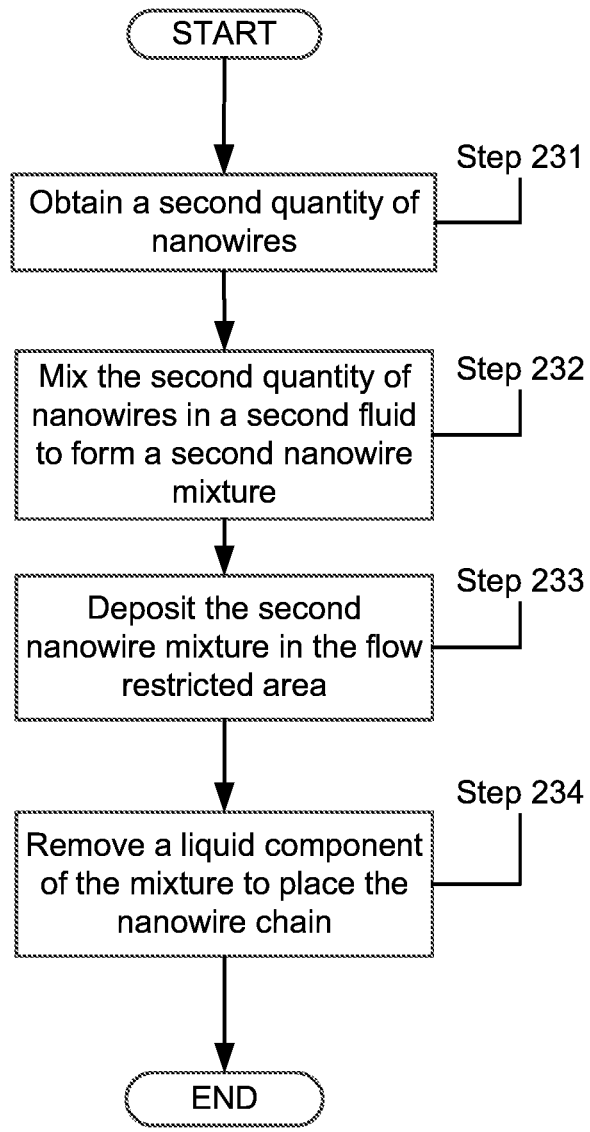
FIG. 2E shows a flowchart of a method of applying a second mixture including nanowires while applying an electric field to the mixture in accordance with one or more embodiments of the invention.

FIG. 2E shows a flowchart in accordance with one or more embodiments of the invention. The method depicted in FIG. 2E may be used to apply a second nanowire mixture to a chain-site in accordance with one or more embodiments of the invention. One or more steps shown in FIG. 2E may be omitted, repeated, and/or performed in a different order among different embodiments.

In Step 231, a quantity of nanowires may be obtained. The nanowires may be of any material as may be desired. In one or more embodiments of the invention, the nanowires may be the same as used in the method shown in FIG. 2C. For example, the nanowires may be a conducting or semiconducting material. In one or more embodiments of the invention, the nanowires may be rhodium. In other embodiments of the invention, the nanowires may be carbon nanotubes. In other embodiments of the invention, the nanowires may be a conductive material such as, for example, silver, gold, copper, or tin. In still further embodiments of the invention, the nanowires may be a metal alloy.

In one or more embodiments of the invention, the nanowires may have an average length that is much less than a width of a gap of a chain-site. As used herein, much less than the width of the gap is less than one tenth of the width of a gap in the patterned conductive film at a chain-site. In one or more embodiments of the invention, the nanowires may have an average length that is one tenth the width of a gap in the patterned conductive film at a chain-site. In one or more embodiments of the invention, the nanowires may have an average length that is one hundredth the width of a gap in the patterned conductive film at a chain-site. One of ordinary skill in the art will appreciate that nanowires may have varying lengths and an average length of the nanowires refers to a mean length of each of the nanowires.

In one or more embodiments of the invention, the quantity of nanowires is proportional to a number of the chain-sites, e.g., one thousand nanowires for each chain-site. In one or more embodiments of the invention, the quantity of nanowires is greater than 10,000,000 times the number of chain-sites.

In one or more embodiments of the invention, the quantity of nanowires is proportional to gap or width of a chain-sites or a size of the flow restricted area, e.g., one thousand nanowires for each gap.

In Step 232, the nanowires are mixed with a second material to form a mixture. In one or more embodiments of the invention, the second material may be the same as the second material in the method shown in FIG. 2C. The second material may be a fluid. In one or more embodiments of the invention, mixing the nanowires with the second material may suspend the nanowires in the second material.

In one or more embodiments of the invention, the fluid may have a low viscosity. As used herein, a low viscosity is less than 5 centipoise. In one or more embodiments of the invention, the fluid may have a very low viscosity. As used herein, a very low viscosity is less than 2 centipoise.

The fluid may be, for example, ethanol. The fluid may be other materials or combinations of materials without departing from the invention. For example, the fluid may be a mixture of ethanol and methanol, a mixture of ethanol and water, a mixture of ethanol and ethylene glycol, or other mixtures of fluids. In one or more embodiments of the invention, the fluid may be a non-polar solvent such as carbon tetrachloride.

In one or more embodiments of the invention, the second material may include a number of electrically-polarizable molecules. As will be described below, the polarizable molecules may facilitate the chaining of nanowires to form a nanowire chain.

In one or more embodiments of the invention, the mixture including the nanowires may be formed by stirring the nanowires into a predetermined quantity of the second material. In one or more embodiments of the invention, the mixture including the nanowires may be formed by sonicating the nanowires into a predetermined quantity of the second material.

The mixture may include other materials such as ligands, stabilizers, polymers, or other materials. The other materials may improve the ability of the nanowires to be suspended in the second material. The other materials may modify a viscosity, surface tension, wetting, or other rheological property of the mixture.

In Step 233, the second material may be deposited in the flow restricted area while the electric field is still being applied. Depositing the second material while still applying the electric field may polarize the nanowires of the second material. Polarizing the nanowires of the second material may cause the nanowires to chain to the existing nanowire chains due to dipole forces to form a nanowire chain that bridges a length of the gap in the patterned conductive film.

In Step 234, a liquid component of the mixture is removed to place the nanowire chain in the gap. By removing the liquid component of the mixture, the ion cloud proximate to each portion of the patterned conductive film may be removed and thereby enable each end of the nanowire chain to be disposed on a respective portion of the patterned conductive film.

The method may end following Step 234.

Figure 2F:
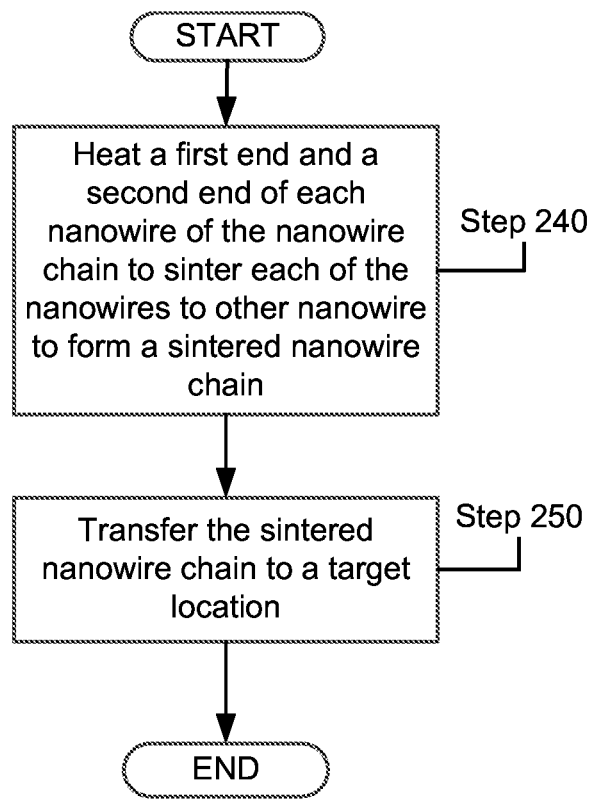
FIG. 2F shows a flowchart of a continuation of the method of FIG. 2A in accordance with one or more embodiments of the invention.

FIG. 2F shows a flowchart in accordance with one or more embodiments of the invention. The method depicted in FIG. 2F may be a continuation of the method shown in FIG. 2A in accordance with one or more embodiments of the invention. One or more steps shown in FIG. 2F may be omitted, repeated, and/or performed in a different order among different embodiments.

In Step 240, a first end and a second end of each nanowire of the nanowire chain may be heated to sinter each of the nanowires to other nanowires to form a sintered nanowire chain. The first and second ends may be heated by, for example, conductive heating, convective heating, inductive heating, and/or radiant heating. The first and second ends may be heated by other methods without departing from the invention. Sintering the ends may reduce a contact resistance of a contact between the nanowires.

In Step 250, the sintered nanowire chain may be transferred to a target location. The target location may be a second substrate such as a glass substrate. The nanowire chain may be transferred by aligning the nanowire chain device and/or the nanowire chain to the second substrate, pressing the nanowire chain device to the second substrate, and releasing the nanowire chain from the nanowire device while pressed against the second substrate. Releasing the nanowire chain may attach the nanowire chain to the second substrate at the target location.

While not shown in FIG. 1A or 1B, the nanowire chain device may include a layer of material disposed between the nanowire chain and the patterned conductive field and/or substrate that facilitates release of the nanowire chain. For example, the material may be Polydimethylsiloxane or another low surface energy material. By incorporating such a material, release of the nanowire chains may be accomplished by merely pressing the nanowire chains against a target that has a higher surface energy. The difference in surface energy may cause the nanowire chain to transfer from the low energy surface to the higher energy surface of the target location.

The method may end following Step 250.

As discussed above, a nanowire chain device in accordance with embodiments of the invention may be produced by the methods shown in FIGS. 2A through 2F. To further explain production of nanowire devices in accordance with embodiments of the invention, an example of a production of such a device is shown by way of example in FIGS. 3A through 3I. The example described in FIGS. 3A-3I is for exemplary purposes only and is not intended to limit the scope of the invention.

Figure 3A:
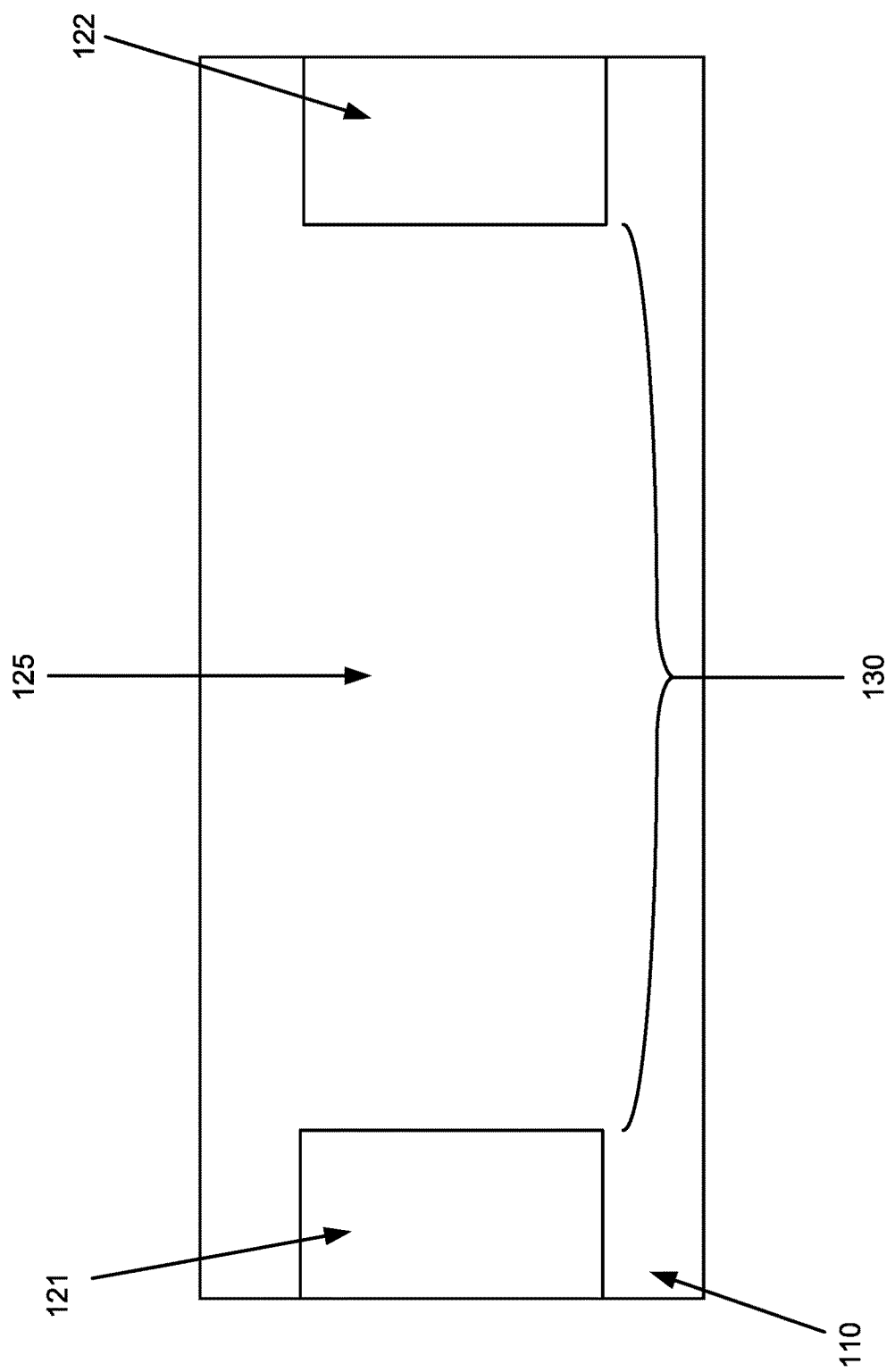
FIG. 3A shows a top view diagram of an example of a patterned conductive film in accordance with one or more embodiments of the invention.
Figure 3B:
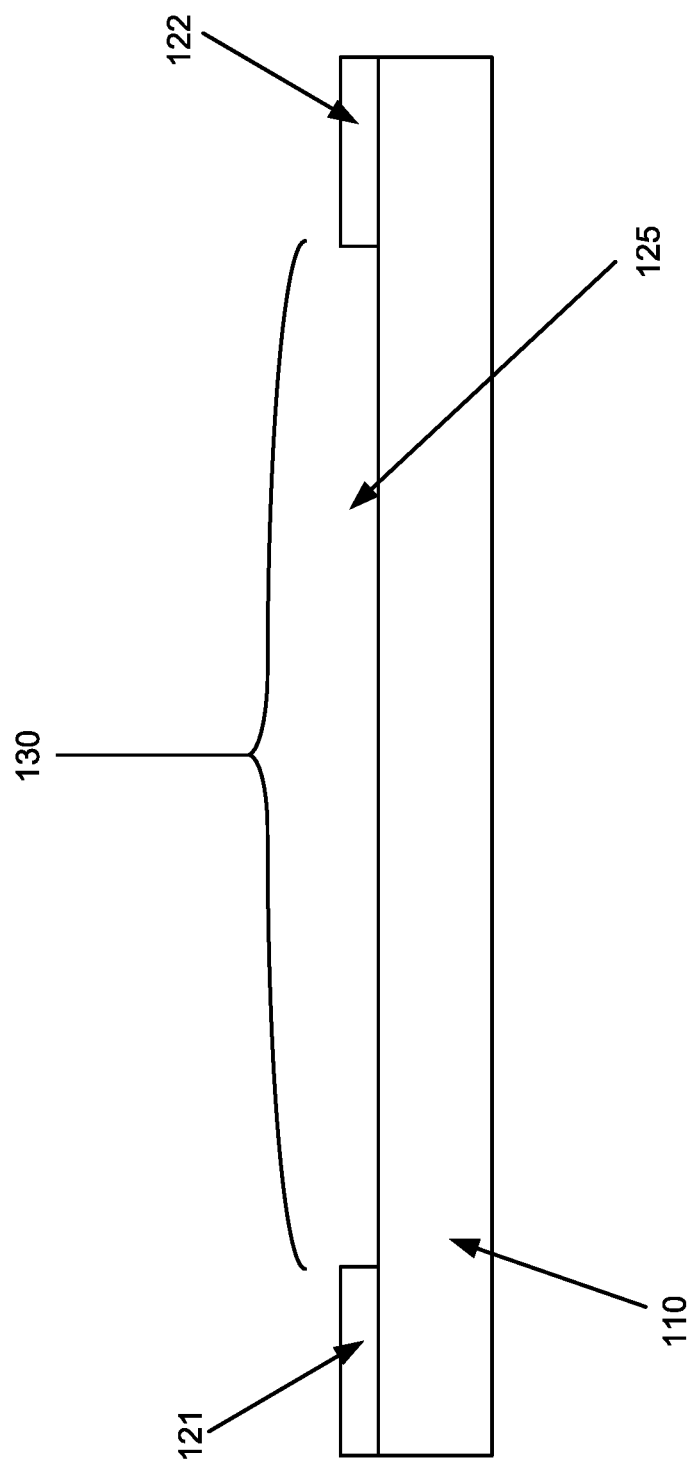
FIG. 3B shows a side view diagram of the example patterned conductive film of FIG. 3A in accordance with one or more embodiments of the invention.

Turing to the example, FIG. 3A shows a top view diagram of an example of a patterned conductive film (120) in accordance with embodiments of the invention. FIG. 3B shows a side view diagram of the example shown in FIG. 3A. The patterned conductive film (120) was produced by applying a conductive film to a substrate (110). The conductive film was etched to remove portions of the conductive film to form the patterned conductive film (120). The patterned conductive film includes a first portion (121) and a second portion (122). The first portion (121) and second portion (122) are separated by a gap (125) that electrically isolates the portions from each other. The first portion (121), the second portion (122), and the gap (125) may be a chain-site (130) for a nanowire chain.

Figure 3C:
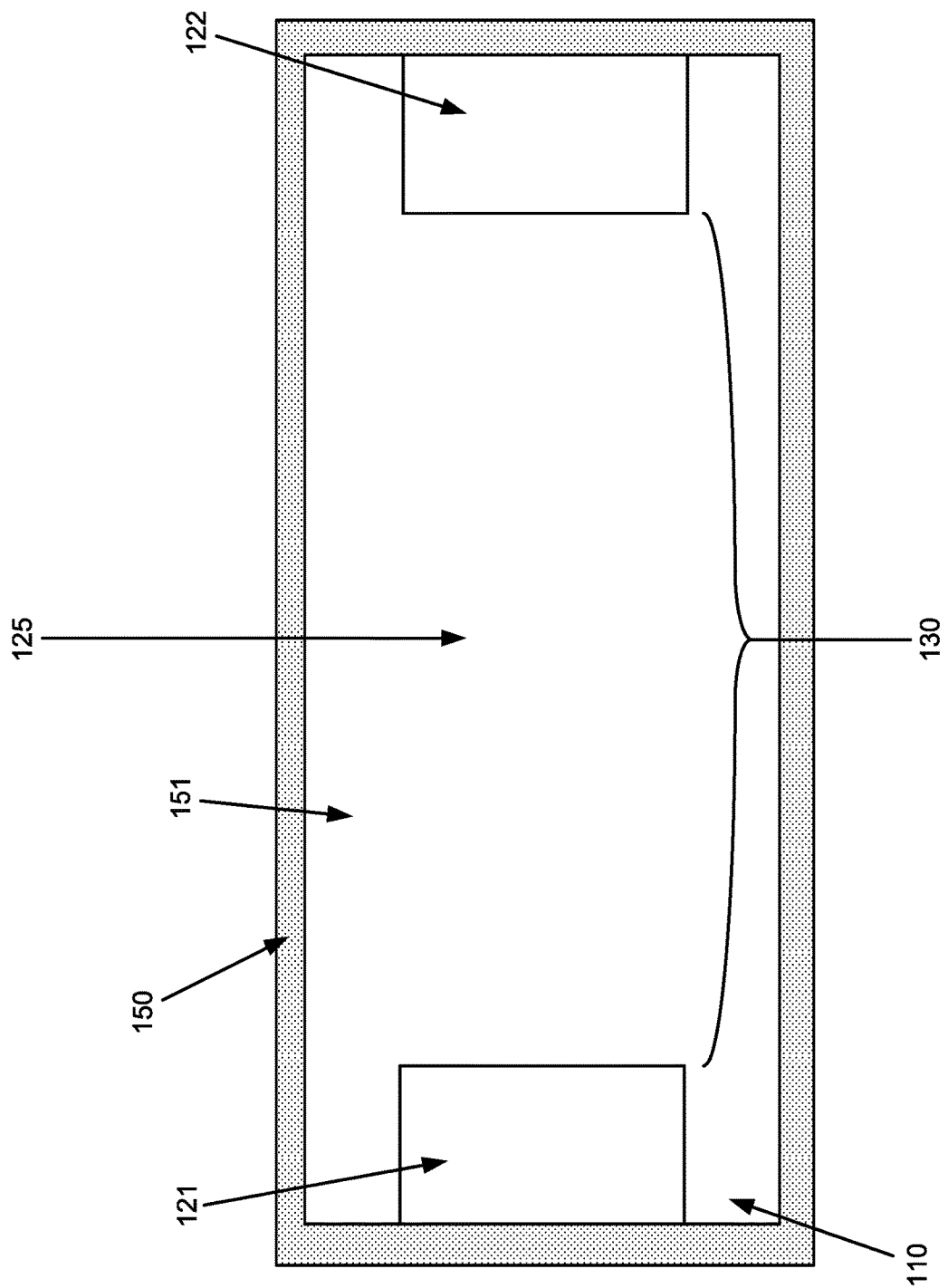
FIG. 3C shows a top view diagram of an example of a dam in accordance with one or more embodiments of the invention.
Figure 3D:
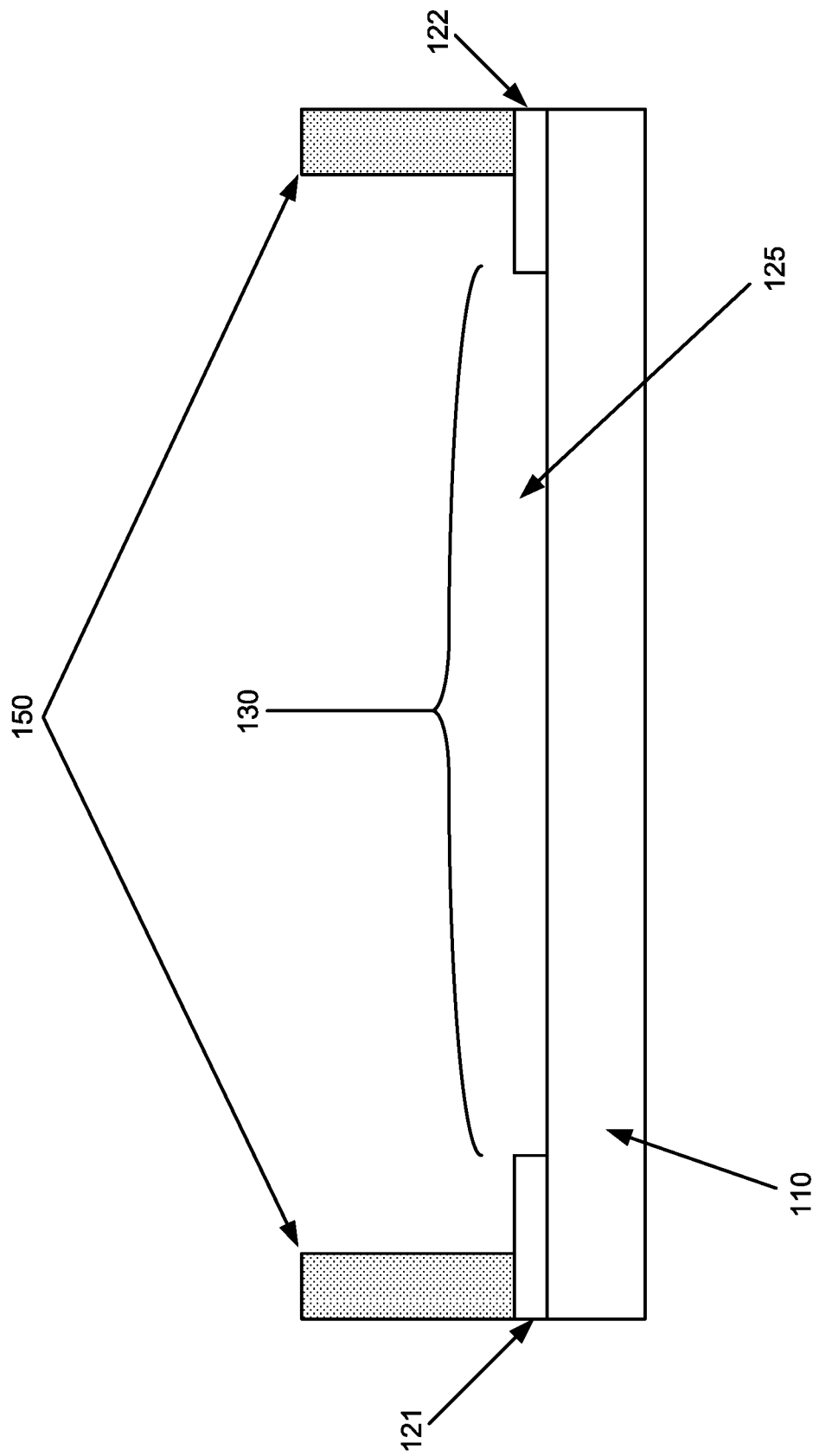
FIG. 3D shows a side view diagram of the example dam of FIG. 3C in accordance with one or more embodiments of the invention.

FIG. 3C shows a top view diagram of an example of applying a dam (150) to form a flow restricted area (151) in accordance with embodiments of the invention. FIG. 3D shows a side view diagram of the example shown in FIG.

3C. The dam (150) was applied by pressing the dam (150) to the nanowire device to form a flow restricted area (151). The flow restricted area (151) includes the chain-site (130). A seal is formed between the dam (150) and the nanowire device and thereby prevents material from flowing along the nanowire device outside of the flow restricted area (151).

Figure 3E:
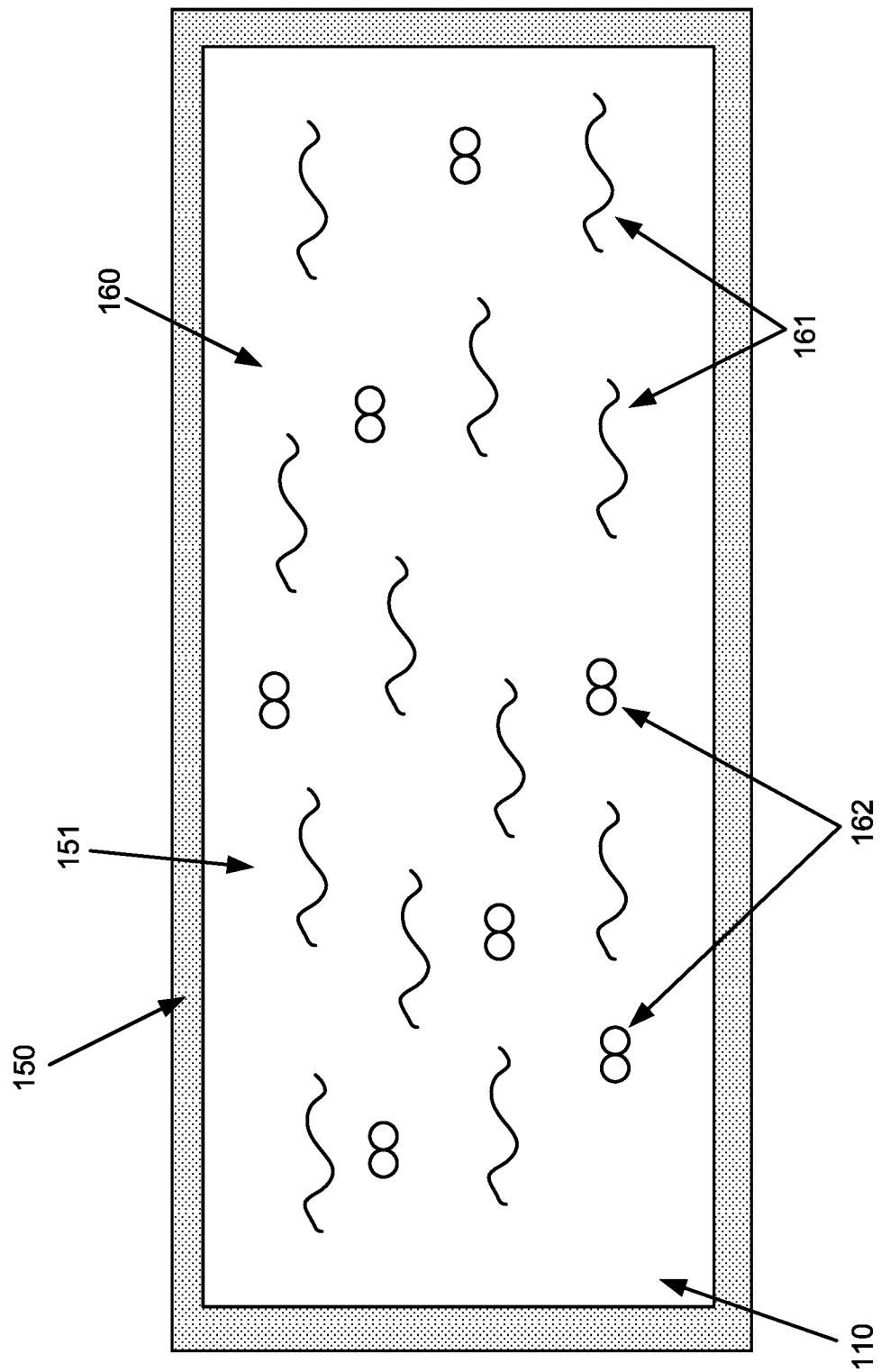
FIG. 3E shows a top view diagram of an example of applying a mixture including nanowires in accordance with one or more embodiments of the invention.
Figure 3F:
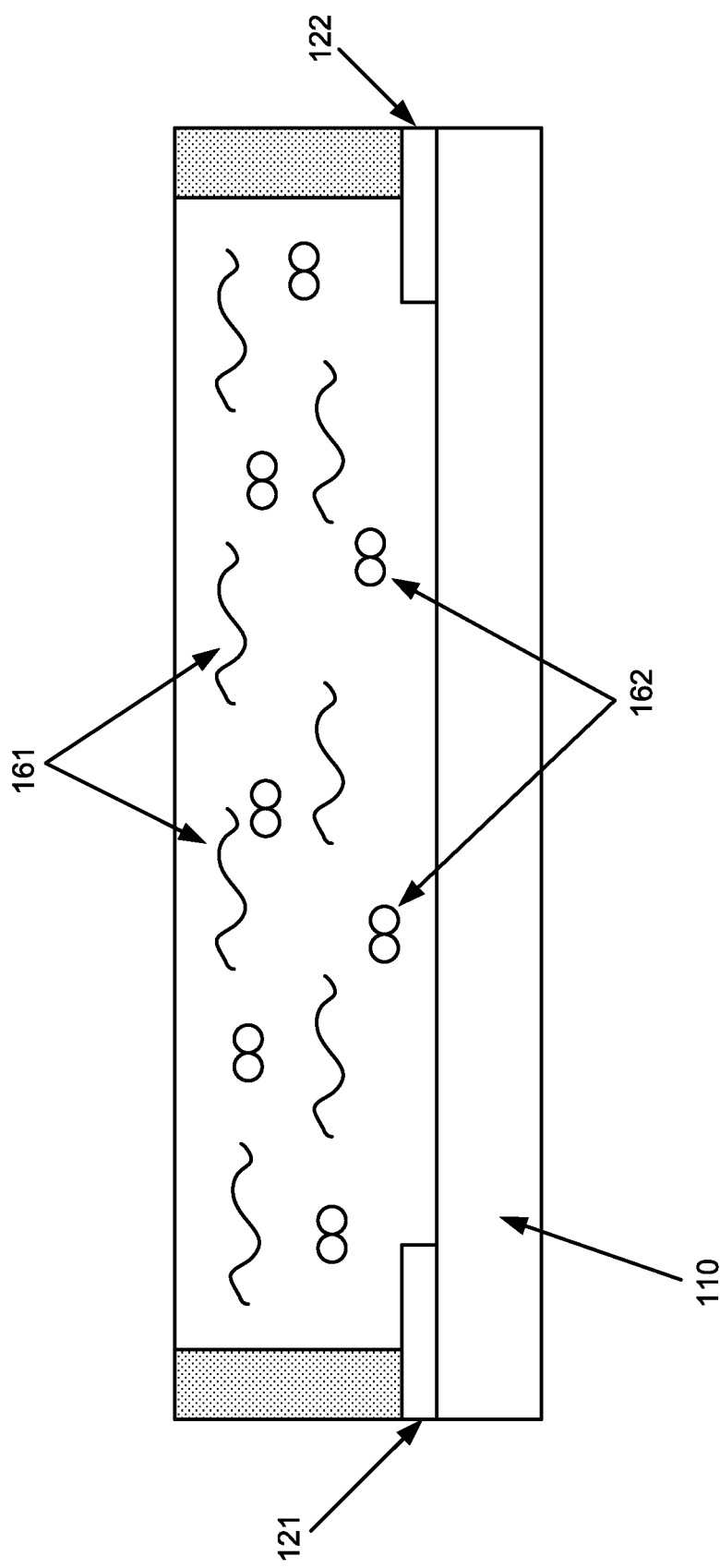
FIG. 3F shows a side view diagram of the example of applying a mixture including nanowires of FIG. 3E in accordance with one or more embodiments of the invention.

FIG. 3E shows a top view diagram of an example of applying a mixture including nanowires (160) in the flow restricted area (151) in accordance with embodiments of the invention. FIG. 3F shows a side view diagram of the example shown in FIG. 3E. The mixture including nanowires (160) was applied by dispensing the mixture including nanowires (160) in the flow restricted area. The mixture including nanowires (160) flowed to fill the flow restricted area (151) including the chain-site (not shown). The mixture includes nanowires (161) and a polarizable portion (162). The polarizable portion (162) may be a number of polarizable molecules FIG. 3G shows a side view diagram of an example of applying an electric field (171) to the mixture including nanowires (160) in accordance with embodiments of the invention. The electric field was applied by applying a time varying voltage, supplied by an alternating current source (170), to the first portion of the patterned conductive film (121) and the second portion of the patterned conductive film (122). Applying the voltage generated the electric field (171), indicated by dashed lines, at the chain-site.

Applying the electric field polarizes the polarizable portion (not shown) and thereby forms ion clouds (163) disposed proximate to the first portion of the patterned conductive film (121) and the second portion of the patterned conductive film (122).

The electric field causes the nanowires (161) to align to the electric field (171) and the ion clouds (163) prevent the nanowires (161) from coming into contact with the patterned conductive film and thereby forms suspended nanowire chains disposed proximate to each portion of the patterned conductive film.

A portion of the nanowires (161) close to the patterned conductive film may be attracted to the edge or the patterned conductive film via dielectrophoretic force. A second portion of the nanowires (161) away from the conductive film attract with adjacent nanowires via dipole-dipole interaction and create nanowire chains that eventually will attach to the nanowire chains in the vicinity of the patterned conductive film.

FIG. 3H shows a side view diagram of an example of applying a second mixture including nanowires in the flow restricted area (151) while continuing to apply the electric field (171) in accordance with embodiments of the invention. When applied, the nanowires of the second mixture become polarized by the electric field (171) and thereby are aligned to the electric field (171). Aligning the nanowires chains the nanowires of the second mixture to the existing chains to form a nanowire chain having a length that extends across the width of a gap in the patterned conductive film.

Figure 3I:
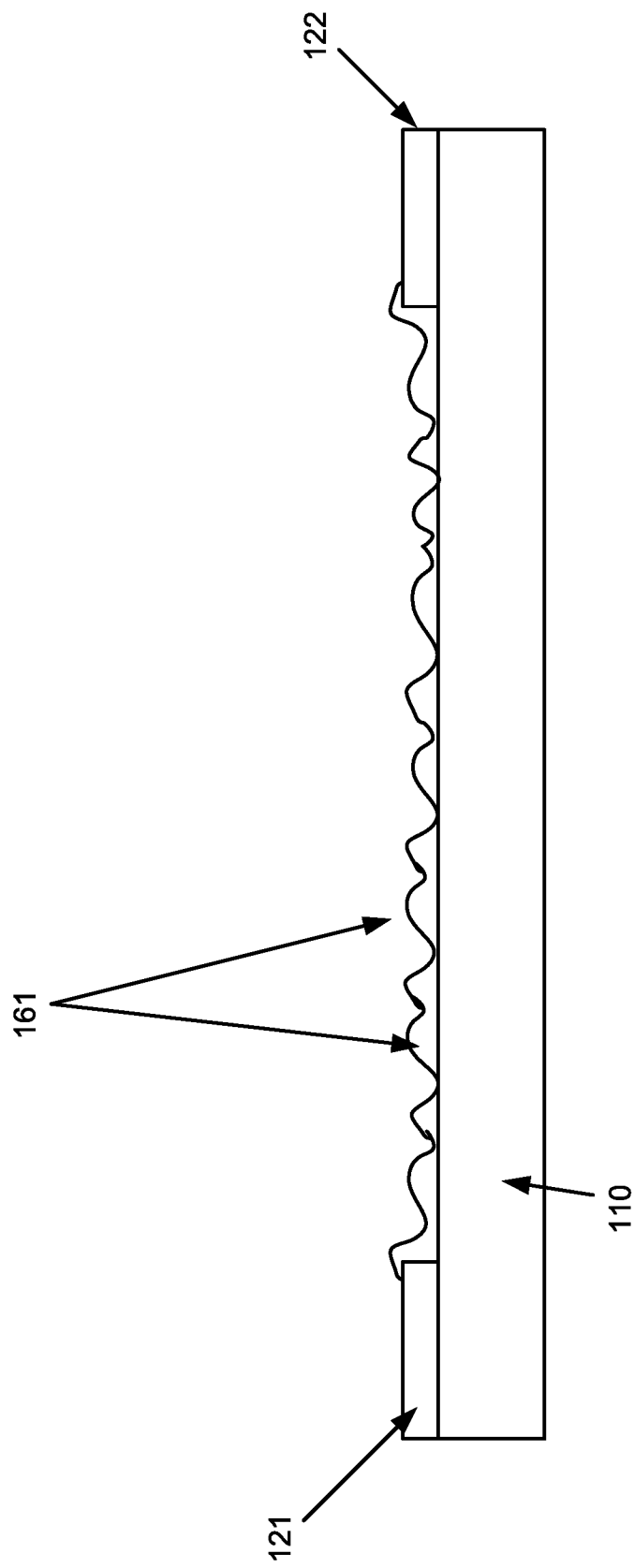
FIG. 3I shows a side view diagram of an example of a nanowire chain disposed at a chain-site in accordance with one or more embodiments of the invention.

Once the nanowire chain is formed, a liquid portion of mixture is removed to place the nanowire chain with the gap to bridge the gap between the first portion of the patterned conductive film (121) and the second portion of the patterned conductive film (122). FIG. 3I shows a side view diagram of an example of the nanowires (161) bridging the gap between the first portion of the patterned conductive film (121) and the second portion of the patterned conductive film (122).

Embodiments of the invention may provide one or more of the following advantages: (i) embodiments of the invention may minimize disruptive torque, capillary action, aggregation of nanowires in a mixture, electrothermal forces, dielectrophoresis forces, electroosmotice forces, and/or electrode polarization that would otherwise prevent nanowire chains from being deposited at chain-sites, (ii) embodiments of the invention may provide a method of producing nanowire chain devices quickly, inexpensively, and compatible with mass electronic production techniques such as photolithography, and (iii) embodiments of the invention provide a scalable method of producing nanowire chain devices that uses an amount of time for production that is independent of the number of nanowire chain devices produced.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method of depositing nanowire chains, comprising:
    applying a nanowire mixture to a chain-site, wherein the chain-site comprises a patterned conductive film covering at least a portion of a surface of a substrate, wherein the patterned conductive film comprises a gap; and
    after applying the nanowire mixture, forming a nanowire chain that is suspended adjacent to a portion of the patterned conductive film and prevented from coming in contact with the patterned conductive film by generating an electric field proximate to the patterned conductive film; and
    depositing the nanowire chain across the gap by removing a liquid portion of the nanowire mixture,
    wherein an average length of the nanowires of the nanowire mixture is less than a width of the gap.

2. The method of claim 1, wherein a number of nanowires in the nanowire mixture is greater than 10,000,000 per chain-site.

3. The method of claim 1, wherein applying the nanowire mixture to the chain-site comprises:
    obtaining a mixture comprising nanowires and polarizable material;
    generating a flow restricted area that surrounds the chain-site; and
    depositing a portion of the mixture in the flow restricted area.

4. The method of claim 3, wherein the polarizable material has a viscosity less than 5 centipoise.

5. The method of claim 3, wherein the polarizable material has a viscosity less than 2 centipoise.

6. The method of claim 3, wherein the polarizable material comprises ethanol.

7. The method of claim 3, wherein generating the flow restricted area comprises:
    obtaining a dam based on a size of the chain-site;
    positioning the dam to surround the chain-site; and
    forming a seal, using the dam, that defines a size of the flow restricted area.

8. The method of claim 3, wherein forming the nanowire chain suspended adjacent to the portion of the patterned conductive film comprises:
    polarizing, by the electric field, the nanowires; and
    generating, by the electric field, a field of counter ions disposed between the portion of the patterned conductive film and the nanowires, wherein the field of counter ions repels the nanowires from the portion of the patterned conductive film, wherein the field of counter ions is formed by the polarizable material in response to being exposed to the electric field.

9. The method of claim 8, wherein removing the liquid portion of the nanowire mixture removes the field of counter ions.

10. The method of claim 1, further comprising:

before depositing the nanowire chain, lengthening the nanowire chain by applying a second nanowire mixture while continuing to generate the electric field.

11. The method of claim 1, further comprising:

after depositing the nanowire chain, sintering the nanowires of the nanowire chain.

12. The method of claim 1, further comprising:

after depositing the nanowire chain, transferring the nanowire chain to a target location.

13. The method of claim 12, wherein transferring the nanowire chain to the target location comprises:

aligning the nanowire chain to the target location;

pressing the nanowire chain to the target location; and releasing the nanowire chain from the chain-site to transfer the nanowire chain to the target location.

14. The method of claim 1, wherein generating the electric field proximate to the patterned conductive film comprises:

applying a voltage across the gap.

15. The method of claim 14, wherein the voltage has a magnitude greater than 4 Vrms.

16. The method of claim 15, wherein the voltage has a magnitude greater than 7 Vrms.

17. The method of claim 1, wherein the electric field is a time varying electric field.

18. The method of claim 1, wherein the electric field has a frequency of variation that is greater than 10 kilohertz.

19. The method of claim 1, wherein the electric field has a frequency of variation that is greater than 10 kilohertz and less than 10 gigahertz.

20. The method of claim 1, wherein the electric field has a frequency of variation based, in part, on a permittivity of the nanowire mixture.

21. The method of claim 1, wherein the electric field has a minimum frequency based on a conductivity of the nanowire mixture.

* * * * *